(12) United States Patent
Deng et al.

(10) Patent No.: US 10,848,151 B1
(45) Date of Patent: Nov. 24, 2020

(54) DRIVING SYSTEMS

(71) Applicant: Shanghai Zhaoxin Semiconductor Co., Ltd., Shanghai (CN)

(72) Inventors: Yulin Deng, Shanghai (CN); Xinwen Ma, Shanghai (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 16/657,013

(22) Filed: Oct. 18, 2019

(30) Foreign Application Priority Data

Sep. 11, 2019 (CN) .......................... 2019 1 0857142

(51) Int. Cl.
*H03K 17/687* (2006.01)
*H03K 17/693* (2006.01)

(52) U.S. Cl.
CPC ....... *H03K 17/6872* (2013.01); *H03K 17/693* (2013.01)

(58) Field of Classification Search
CPC .......................... H03K 17/693; H03K 17/6872
USPC .......................... 327/108, 109, 110, 111, 112
See application file for complete search history.

(56) References Cited

U.S. PATENT DOCUMENTS

| | | | |
|---|---|---|---|
| 6,356,141 B1 * | 3/2002 | Yamauchi | G05F 3/262 327/543 |
| 7,728,630 B1 * | 6/2010 | Ren | H03K 19/00384 326/86 |
| 8,476,941 B2 * | 7/2013 | Agut | H03K 19/00384 327/111 |
| 2011/0140774 A1 * | 6/2011 | Kaya | H03F 3/3022 330/124 R |

* cited by examiner

*Primary Examiner* — John W Poos
(74) *Attorney, Agent, or Firm* — McClure, Qualey & Rodack, LLP

(57) ABSTRACT

The present invention provides a driving system operating in a first or second modes. The driving system includes first and second resistance adjusting circuits, a divider, a controller and a driver. The divider divides a second resistance adjusting signal generated by the second resistance adjusting circuit by a standard value to generate a first control signal. The controller receives the first control signal and generates a second control signal. When the driving system operates in the first mode, the driver receives the second control signal, according to the second control signal, the driver adjusts an output impedance of itself and adjusts equalization amplitude of a first differential output signal generated by itself. When the driving system operates in the second mode, the driver generates a second differential output signal and adjusts the output impedance according to a first resistance adjusting signal generated by the first resistance adjusting circuit.

30 Claims, 19 Drawing Sheets

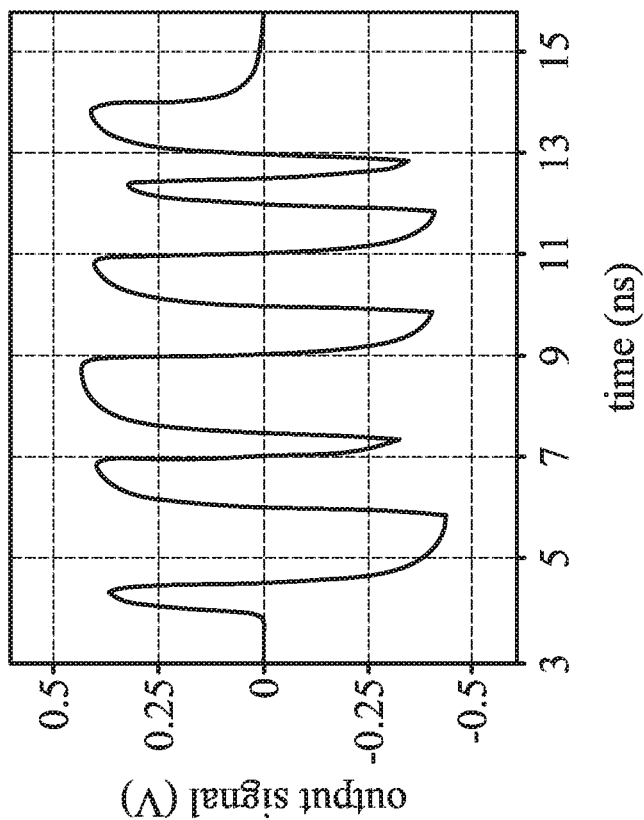
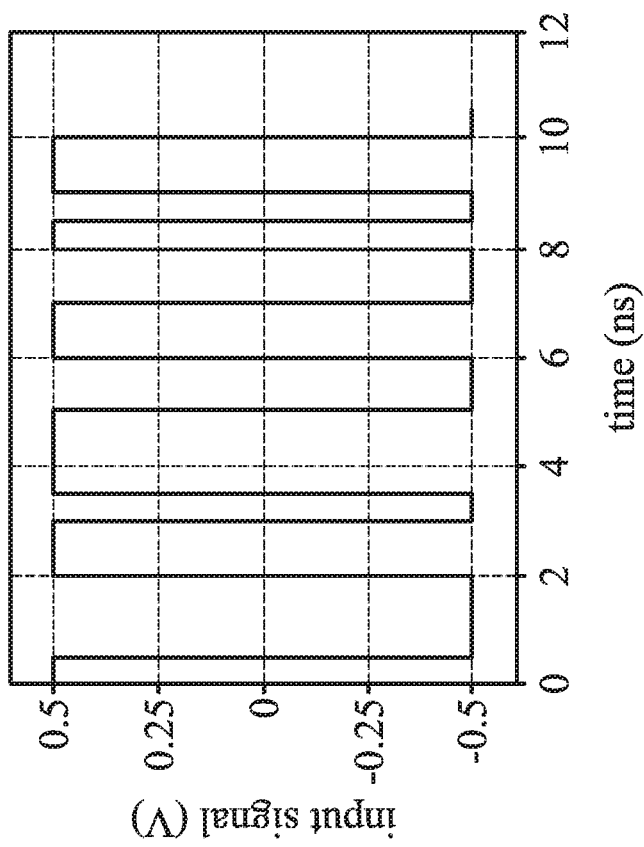
FIG. 10B
FIG. 10A

DRIVING SYSTEMS

CROSS REFERENCE TO RELATED APPLICATIONS

This Application claims priority of China Patent Application No. 201910857142.2, filed on Sep. 11, 2019, the entirety of which is incorporated by reference herein.

BACKGROUND OF THE INVENTION

Field of the Invention

The invention relates to a driving system, and more particularly to a driving system for a transmitter terminal.

Description of the Related Art

In order to perform high-speed communication between electronic devices or between the chips, a Serializer/Deserializer (SerDes) system is provided. The SerDes is a time division multiplexing, point-to-point serial communication technology. The SerDes system comprises multiple lanes. Specifically, each lane of the SerDes link group comprises a transmitting terminal, a channel, and a receiving terminal. At the transmitting terminal, the multiple low-speed parallel signals are converted into a high-speed serial signal which is transmitted to the receiving terminal through a transmission channel. The receiving terminal then converts the received high-speed serial signal to low-speed parallel signals.

In each lane, the types of driver available at the transmitting terminal include a voltage-mode logic (VML) mode driver, a low-voltage differential signaling (LVDS) mode driver, and the like. In general, the selected driver supports only one mode. However, as the users' needs are more diversified, a driver that may be compatible with both of the VML mode and the LVDS mode is required, so that the driving system can selectively operate at the VML mode which consumes less power and adopts an operation with a low supply voltage or the LVDS mode which induces stable current(s), easily controls equalization (EQ), and is not affected by the power supply.

BRIEF SUMMARY OF THE INVENTION

The present invention provides a driving system that may operate in a first mode or a second mode. The driving system comprises a first resistance adjusting circuit, a second resistance adjusting circuit, a divider, a second controller and a driver. The first resistance adjusting circuit generates and outputs a first resistance adjusting signal. The second resistance adjusting circuit generates and outputs a second resistance adjusting signal. The divider is coupled to the second resistance adjusting circuit. The divider receives the second resistance adjusting signal and divides the second resistance adjusting signal by a standard value to generate a first control signal. The second controller is coupled to the divider. The second controller receives the first control signal and generates a second control signal. When the driving system operates in the first mode, the driver is coupled to the second controller to receive the second control signal, and the driver adjusts an output impedance of itself and adjusts equalization amplitude of a first differential output signal generated by the driver according to the second control signal. When the driving system operates in the second mode, the driver is coupled to the first resistance adjusting circuit to receive the first resistance adjusting signal, and the driver generates a second differential output signal and adjusts the output impedance according to the first resistance adjusting signal.

The present invention provides a driving system operating in a first mode. The driving system comprises a second resistance adjusting circuit, a divider, a second controller, and a driver. The second resistance adjusting circuit generates and outputs a second resistance adjusting signal. The divider is coupled to the second resistance adjusting circuit. The divider receives the second resistance adjusting signal and dividing the second resistance adjusting signal by a standard value to generate a first control signal. The second controller is coupled to the divider. The second controller receives the first control signal and generates a second control signal. The driver is coupled to the second controller to receive the second control. The driver adjusts an output impedance of itself and adjusts equalization amplitude of a differential output signal generated by the driver according to the second control signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 10A and 10B are waveforms before and after a signal input to a channel according to an embodiment of the present invention, respectively;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
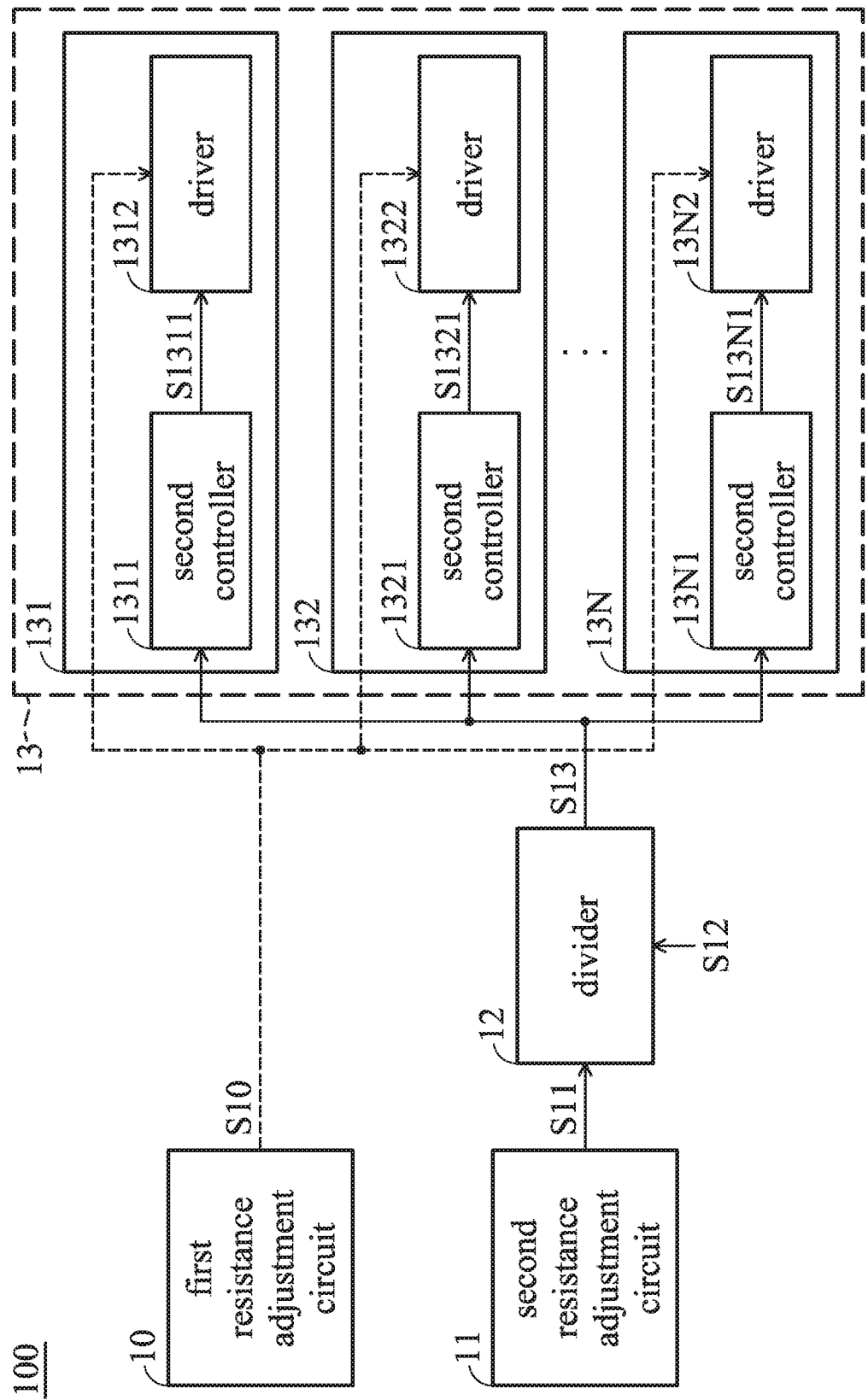
FIG. 1 is a schematic diagram showing a driving system 100 according to an embodiment of the invention.

Several embodiments of the invention are described below with reference to the accompanying drawings. FIG. 1 is a schematic diagram of a driving system 100 in accordance with an embodiment of the present invention. Referring to FIG. 1, the driving system 100 comprises a first resistance adjusting circuit 10, a second resistance adjusting circuit 11, a divider 12, and a set of lanes 13. The set of lanes 13 comprises at least one lane 131~13N, and the transmitting (TX) terminal of each lane comprises a second controller and a driver. For example, the transmitting terminal of the lane 131 comprises a second controller 1311 and a driver 1312, the transmitting terminal of the lane 132 comprises a second controller 1321 and a driver 1322, and the transmitting terminal of the lane 13N comprises a second controller 13N1 and a driver 13N2.

The first resistance adjusting circuit 10 generates and provides a first resistance adjusting signal S10. Each of the drivers 1312~13N2 may be coupled to the first resistance adjusting circuit 10 to adjust the output impedance of each of the drivers 1312~13N2 according to the first resistance adjusting signal S10, wherein each of the drivers 1312~13N2 is in a first mode, such as in a low-voltage differential signaling (LVDS) mode. The second resistance adjusting circuit 11 generates a second resistance adjusting signal S11. The second resistance adjusting circuit 11 is coupled to the divider 12 to output a second resistance adjusting signal S11 to the divider 12. The divider 12 receives the second resistance adjusting signal S11 and a standard value S12, and divides the second resistance adjusting signal S11 by the standard value S12, thereby generating a first control signal S13. The divider 12 is coupled to each of the second controllers 1311~13N1 to provide the first control signal S13 to each of the second controllers 1311~13N1. The drivers 1312~13N2 may be respectively coupled to a corresponding controller of the second controllers 1311~13N1 to receive a corresponding signal of the second control signals S1311~S13N. So that the output impedance of each of the drivers 1312~13N2 in a second mode, such as voltage-mode logic (VML) mode, may be adjusted according to the corresponding signal of the second control signals S1311~S13N1, and the EQ amplitude requirement of each of the drivers 1312~13N2 may be satisfied.

According to an embodiment of the invention, when the driving system 100 operates in the first mode, such as the LVDS mode, the first resistance adjusting circuit 10 is enabled, the second resistance adjusting circuit 11, the divider 12, and each of the second controllers 1311~13N1 are disabled. The first resistance adjusting signal S10 is provided to each of the drivers 1312~13N2 to adjust the output impedance of each of the drivers 1312~13N2. According to an embodiment of the invention, when the driving system 10 operates in the second mode, such as the VML mode, the second resistance adjusting circuit 11, the divider 12, and each of the second controllers 1311~13N1 are enabled, the first resistance adjusting circuit 10 is disabled. The second control signals S1311~S13N1 are respectively provided to the drivers 1312~13N2 to adjust the output impedance of a corresponding one of the drivers 1312~13N2.

According to another embodiment of the present invention, a switch or a selector may be provided for each of the drivers 1312~13N2, so that each of the drivers 1312~13N2 may be selectively coupled to the first resistance adjusting circuit 10 or the corresponding one of the second controllers 1311~13N1. Therefore, each of the drivers 1312~13N2 may receive the first resistance adjusting signal S10 or the corresponding one of the second control signals S1311~S13N1 to support switching between the first mode (such as the LVDS mode) or the second mode (such as the VML mode).

Figure 2:
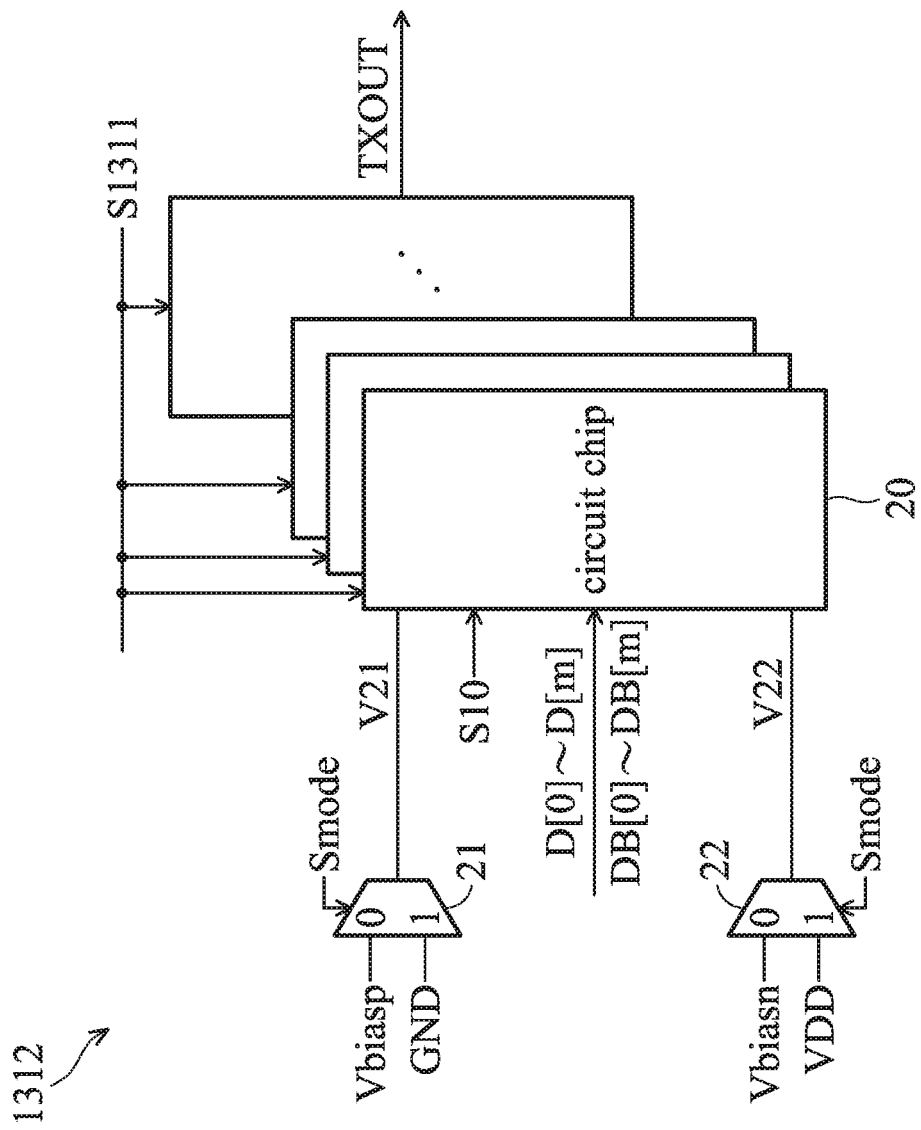
FIG. 2 is a schematic diagram showing a driver 1312 according to an embodiment of the invention.

FIG. 2 is a schematic diagram showing a driver 1312 according to an embodiment of the present invention. Based on the teachings of FIG. 2, those skilled in the art will appreciate that the other lanes shown in FIG. 1 may configure the same driver as the driver 1312 shown in FIG. 2.

The driver 1312 operates in the VML mode or the LVDS mode. Referring to FIG. 2, the driver 1312 comprises a multiplexer 21, a multiplexer 22, and a plurality of slice units 20. The plurality of slice units 20 receive differential serial signals D[0]~D[m] and DB[0]~DB[m], receive the second control signals S1311 or the first resistance adjusting signal S10, and output a serial differential output signal TXOUT. The multiplexer 21 receives a mode selecting signal Smode, a bias voltage Vbiasp, and a first supply voltage (such as, a ground voltage GND). The multiplexer 21 is controlled by the mode selecting signal Smode to provide the bias voltage Vbiasp or the first supply voltage as a control voltage V21 applied to each of the slice units 20. The multiplexer 22 receives the mode selecting signal Smode, the other bias voltage Vbiasn, and a second supply voltage (such as, a supply voltage VDD). The multiplexer 22 is controlled by the mode selecting signal Smode to provide the bias signal Vbiasn or the second supply voltage as a control voltage V22 applied to each of the slice units 20. In an embodiment of the invention, the mode selecting signal Smode is set according to the operation mode of the driver 1312, so that suitable driving voltages may be applied to the slice units 20. When the mode selecting signal Smode is at a first logic level (such as a logic low level), the multiplexer 21 takes the bias voltage Vbiasp as the control voltage V21 according to the selection signal Smode, and the multiplexer 22 takes the bias voltage Vbiasn as the control voltage V22 according to the selection signal Smode, such that the slice units 20 may operate in the LVDS mode. When the mode selecting signal Smode is at a second logic level (such as a logic high level), the multiplexer 21 takes the first supply voltage (such as the ground voltage) as the control voltage V21 according to the mode selecting signal Smode, and the multiplexer 22 takes the second supply voltage (such as the supply voltage VDD) as the control voltage V22 according to the mode selecting signal Smode, such that the slice units 20 may operate in the VML mode. According to an embodiment of the invention, the structure of each of the slice units 20 is the same.

Figure 3:
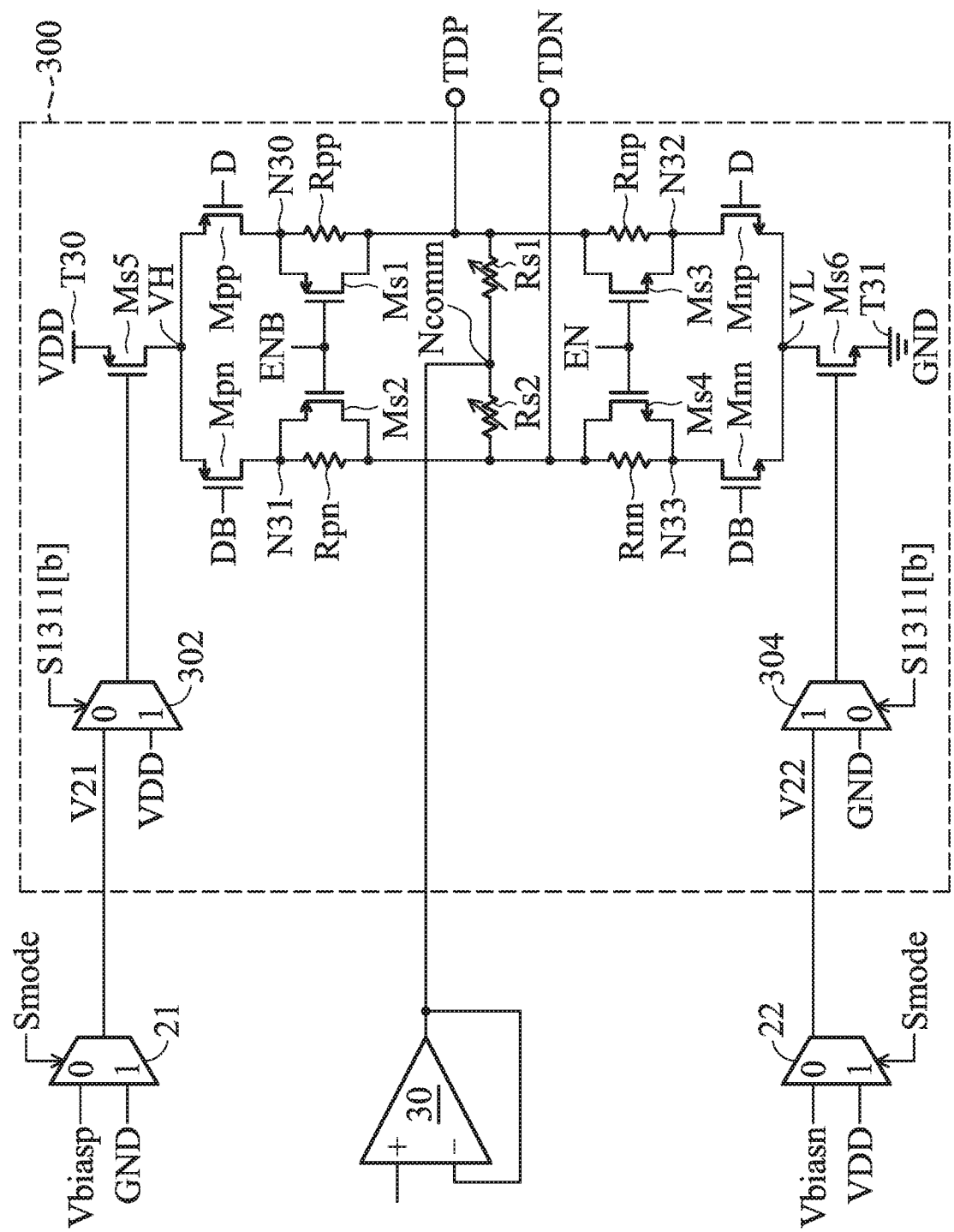
FIG. 3 is a circuit diagram showing a slice module 301 according to an embodiment of the present invention.

FIG. 3 is a schematic diagram showing a slice module 301 according to an embodiment of the present invention. Referring to FIG. 3, the slice module 301 comprises the multiplexer 21 and the multiplexer 22 shown in FIG. 2, and further comprises a slice unit 300 and an operational amplifier 30, wherein the slice unit 300 represents any one of the slice units 20 in FIG. 2. According to an embodiment of the invention, the slice unit 300 may support the operation of the driver 1312 in the LVDS mode or in the VML mode. As shown in FIG. 3, the slice unit 300 comprises a multiplexer 302, a multiplexer 304, resistors Rpn, Rpp, Rnn, and Rnp, P-type transistors Mpn, Mpp, Ms1, Ms2, and Ms5, and N-type transistors Mnn, Mnp, Ms3, Ms4, and Ms6. In this embodiment, the transistors in the slice unit 300 are metal-oxide-semiconductor field-effect transistors (MOSFETs).

Referring to FIG. 3, the multiplexer 302 receives a second control signal S1311[b], the control voltage V21, and the second supply voltage, wherein the second control signal S1311[b] represents a bit of the second control signals S1311. The multiplexer 302 is controlled by the second control signal S1311 [b] to provide the control voltage V21 or the second supply voltage to the gate of the P-type transistor Ms5. The multiplexer 304 receives the second control signal S1311[b], the control voltage V22, and the first supply voltage. The multiplexer 304 is controlled by the second control signal S1311[b] to provide the control voltage V22 or the first supply voltage to the gate of the N-type transistor Ms6. The second control signal S1311[b] may enable or disable the slice unit 300, thereby may control the number of slice units 300 that are effective in the driver 1312. As illustrated in FIG. 3, when the second control signal S1311[b] is at a first logic level (such as a logic low level), the multiplexer 302 provides the control voltage V21 to the gate of the P-type transistor Ms5 according to the second control signal S1311[b], the multiplexer 304 provides the control voltage V22 to the gate of the N-type transistor Ms6 according to the second control signal S1311 [b], the slice unit 300 is enabled. When the second control signal S1311[b] is at a second logic level (such as a logic high level), the second supply voltage is provided to the gate of the P-type transistor Ms5, the first supply voltage is provided to the gate of the N-type transistor Ms6, and the slice unit 300 is disabled. Of course, the manner in which the control is performed by the multiplexer 302 and the multiplexer 304, and the manner in which the second control signal S1311[b] is used as the control signal in FIG. 3 are not intended to limit the present invention. According to an embodiment of the present invention, any manner in which the slice unit 300 may be enabled when the gate of the P-type transistor Ms5 receives the control voltage V21 and the gate of the N-type transistor Ms6 receives the control voltage V22, or the slice unit 300 may be disabled when the gate of the P-type transistor Ms5 receives the second supply voltage and the gate of the N-type transistor Ms6 receives the first supply voltage may be applied. According to another embodiment of the present invention, the second control signal S1311[b] and the complementary signal of the second control signal S1311[b] may be respectively used as the control signals of the multiplexer 302 and the multiplexer 304, or the complementary signal of the second control signal S1311[b] may be directly used as the control signal of the multiplexer 302 and the control signal of the multiplexer 304. According to another embodiment of the present invention, when it is not necessary to adjust the number of effective slice units 300, for example, when it is confirmed that the driver operates in the LVDS mode, the multiplexer 302 and the multiplexer 304 may be disconnected, so that the control voltage V21 is directly provided to the gate of the P-type transistor Ms5, and the control voltage V22 is directly provided to the gate of the N-type transistor Ms6.

Referring to FIG. 3, the source of the P-type transistor Ms5 is coupled to a power supply terminal T30, the drain of the P-type transistor Ms5 is coupled to a node VH, and the gate of the P-type transistor Ms5 receives the output signal of the multiplexer 302. In this embodiment, the power supply terminal T30 receives the supply voltage VDD. The source of the P-type transistor Mpp is coupled to the node VH, the drain of the P-type transistor Mpp is coupled to the node N30, and the gate of the P-type transistor Mpp is coupled to an input signal D. The source of the P-type transistor Mpn is coupled to the node VH, the drain of the P-type transistor Mpn is coupled to the node N31, and the gate of the P-type transistor Mpn is coupled to an inverted input signal DB. The source of the P-type transistor Ms1 is coupled to a node N30, the drain of the P-type transistor Ms1 is coupled to an output terminal TDP of the slice unit 300, and the gate of the P-type transistor Ms1 is coupled to an inverted enable signal ENB. The resistor Rpp is coupled between the node N30 and the output terminal TDP and is in parallel with the P-type transistor Ms1. The source of the P-type transistor Ms2 is coupled to a node N31, the drain of the P-type transistor Ms2 is coupled to an output terminal TDN of the circuit 300, and the gate of the P-type transistor Ms2 is coupled to the inverted enable signal ENB. The resistor Rpn is coupled between the node N31 and the output terminal TDN and is in parallel with the P-type transistor Ms2. The drain of the N-type transistor Ms3 is coupled to the output terminal TDP, the source of the N-type transistor Ms3 is coupled to a node N32, and the gate of the N-type transistor Ms3 is coupled to an enable signal EN. The resistor Rnp is coupled between the output terminal TDP and the node N32 and is in parallel with the N-type transistor Ms3. The drain of the N-type transistor Ms4 is coupled to the output terminal TDN, the source of the N-type transistor Ms4 is coupled to a node N33, and the gate of the N-type transistor Ms4 is coupled to the enable signal EN. The resistor Rnn is coupled between the output terminal TDN and the node N33 and is in parallel with the N-type transistor Ms4. The drain of the N-type transistor Mnp is coupled to the node N32, the source of the N-type transistor Mnp is coupled to a node VL, and the gate of the N-type transistor Mnp is coupled to an input signal D. The drain of the N-type transistor Mnn is coupled to the node N33, the source of the N-type transistor Mnn is coupled to the node VL, and the gate of the N-type transistor Mnn is coupled to the inverted input signal DB. The drain of the N-type transistor Ms6 is coupled to the node VL, the source of the N-type transistor Ms6 is coupled to a power supply terminal T31, and the gate of the N-type transistor Ms6 receives the output signal of the multiplexer 304. In this embodiment, the power supply terminal T31 receives the ground voltage GND. The resistor Rs1 is coupled between the output terminal TDP and a common mode node Ncomm. The resistor Rs2 is coupled between the output terminal TDN and the common mode node Ncomm. The inverting input terminal of the operational amplifier 30 is coupled to the output terminal of the operational amplifier 30, and the output terminal of the operational amplifier 30 is coupled to the common mode node Ncomm. The value of the resistor Rs1 and the resistor Rs2 is determined by the first resistance adjusting signal S10 (not shown).

In the embodiment of FIG. 3, the input signal D and the input signal DB received by the slice unit 300 are a pair of differential signals of the differential serial signals D[0]~D[m] and DB[0]~DB [m], such as D[n] and DB[n], wherein 0≤n≤m. The enable signal EN is inverted with the inverted enable signal ENB. The logic levels of the enable signal EN and the inverted enable signal ENB are associated with the logic level of the mode selecting signal Smode. In detail, when the mode selecting signal Smode is a first logic level to indicate the driver 1312 operating in the LVDS mode, the enable signal EN is a high logic level, and the inverted enable signal ENB is a low logic level. When the mode selecting signal Smode is a second logic level to indicate the driver 1312 operating in VML mode, the enable signal EN is a low logic level, and the inverted enable signal ENB is a high logic level.

According to the connections of the components of the slice unit 300 shown in FIG. 3, due to the relationship between the received signal D and the received signal DB, and due to the relationship between the signal EN and the signal ENB, the P-type transistors Mpn and Mpp are not turned on/off simultaneously, the N-type transistors Mnn and Mnp are not turned on/off simultaneously. The P-type transistors Mpp and the N-type transistor Mnn are turned on/off simultaneously, and the P-type transistor Mpn and the N-type transistor Mnp are turned on/off simultaneously. Specifically, how the slice unit 300 operates in the VML mode and the LVDS mode will be described with reference to FIG. 4 and FIG. 5, respectively.

Figure 4:
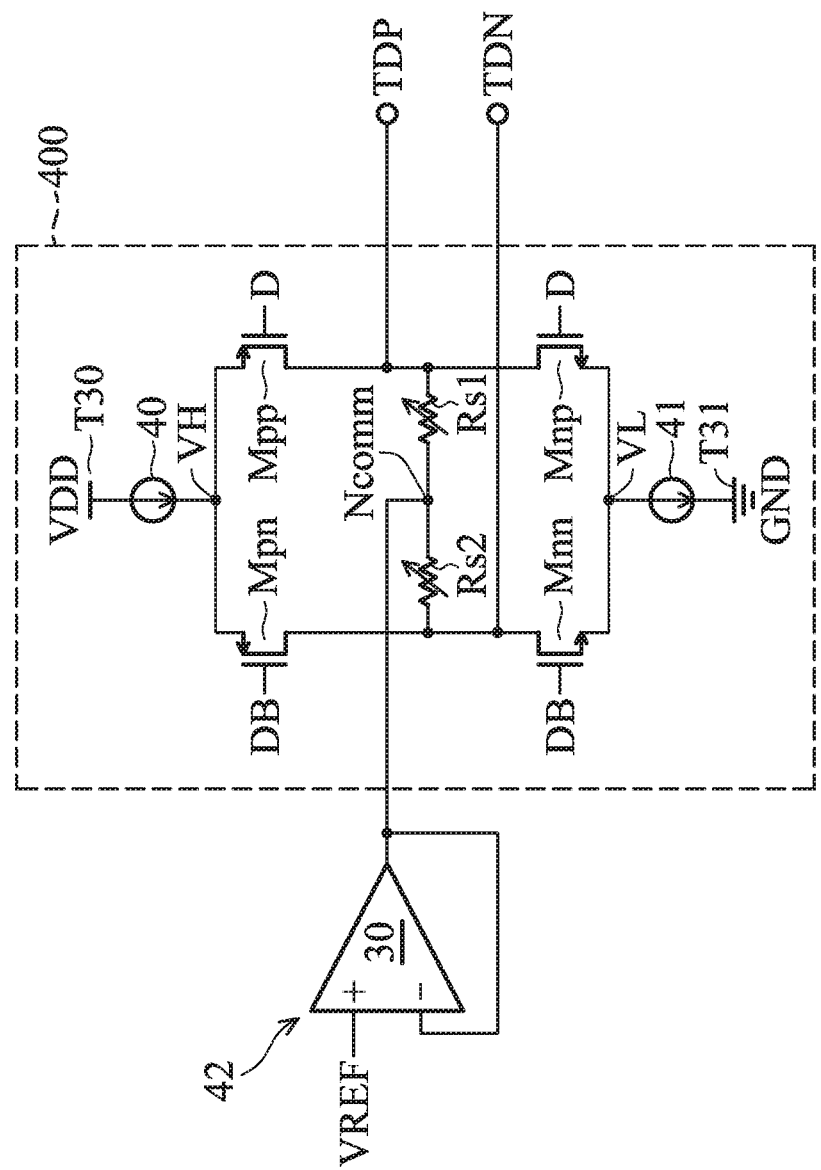
FIG. 4 is a diagram showing an equivalent circuit of a slice module 301 in an LVDS mode according to an embodiment of the invention.

FIG. 4 is a diagram showing an equivalent circuit of the slice module 301 when the driver 1312 operates in the LVDS mode according to an embodiment of the present invention. Referring to FIG. 3, when the mode selecting signal Smode is at a first logic level (such as a logic low level), the driver 1312 operates in the LVDS mode. The multiplexer 21 selects the bias voltage Vbiasp as the control voltage V21 according to the mode selecting signal Smode, and the multiplexer 22 selects the bias voltage Vbiasn as the control voltage V22 according to the mode selecting signal Smode. The second control signal S1311[b] is set to the first logic level, such as a logic low level, and the P-type transistor Ms5 and the N-type transistor Ms6 respectively operate in the saturation region according to the bias voltage Vbiasp and the bias voltage Vbiasn. At this time, the P-type transistor Ms5 operates as a current source 40 shown in FIG. 4, and the N-type transistor Ms6 also operates as a current source 41 shown in FIG. 4. The inverted enable signal ENB is configured to be a low logic level to turn on the P-type transistors Ms1 and Ms2, and the enable signal EN is a high logic level to turn on the N-type transistors Ms3 and Ms4.

Moreover, when the driver 1312 operates in the LVDS mode, a reference voltage VREF is provided to the non-inverting input terminal of the operational amplifier 30, the output terminal of the operational amplifier 30 is coupled to the inverting input terminal of the operational amplifier 30, and the output terminal of the operational amplifier 30 is connected to the common mode node Ncomm. At this time, the operational amplifier 30 forms a unity-gain amplifier 42. The unity-gain amplifier 42 fixes the common mode voltage on the common mode node Ncomm according to the reference voltage VREF to maintain the value of the common mode voltage on the common mode node Ncomm always equal to the value of the reference voltage VREF.

Thus, when the driver 1312 operates in the LVDS mode, the slice unit 300 may be equivalent to the slice unit 400 shown in FIG. 4. The circuit 400 operating in the LVDS mode generates a differential output signal TXOUT between the output terminals TDP and TDN based on the received input signal D and the inverted input signal DB when it is driven by the current source 40 and the current source 41.

Figure 5:
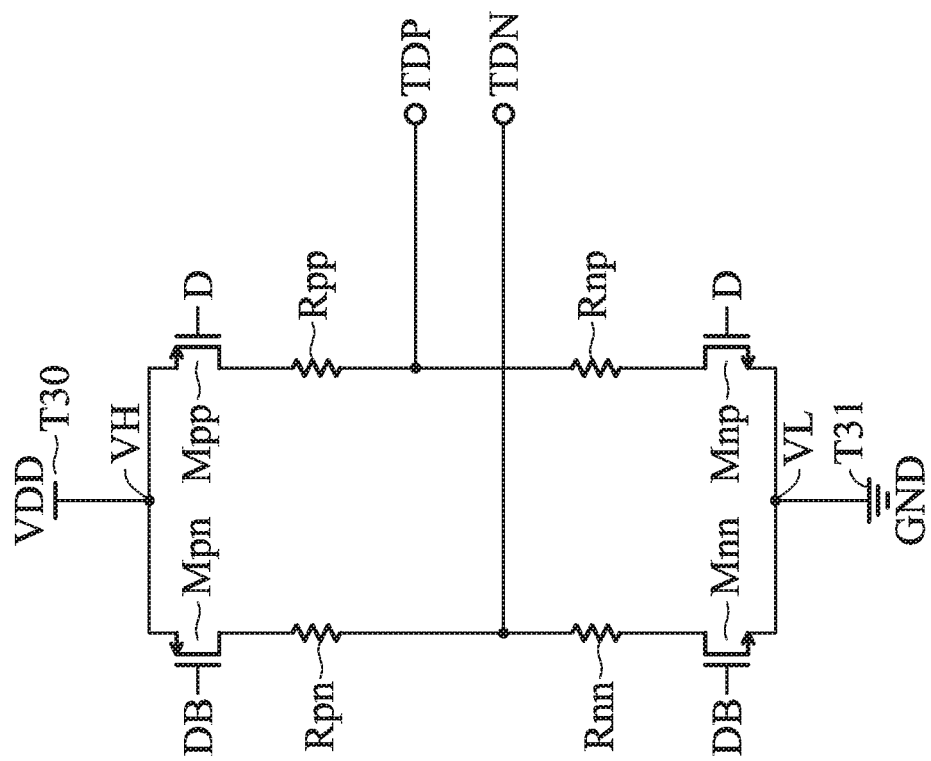
FIG. 5 is a diagram showing an equivalent circuit of a slice unit 300 in a VML mode according to an embodiment of the invention.

FIG. 5 is a schematic diagram showing a slice unit 500 when the driver 1312 operates in the VML mode according to an embodiment of the invention. The slice unit 500 is an equivalent circuit of the slice unit 300 shown in FIG. 3 operating in the VML mode. Referring to FIG. 3, when the mode selecting signal Smode is set to a second logic level, the slice unit 300 operates in the VML mode. The multiplexer 21 selects the ground voltage GND as the control voltage V21 according to the mode selecting signal Smode, and the multiplexer 22 selects the supply voltage VDD as the control voltage V22 according to the mode selecting signal Smode. When the second control signal S1311[b] is at a second logic level (such as a logic high level), the P-type transistor Ms5 is turned off according to the second supply voltage, the N-type transistor Ms6 is turned off according to the first supply voltage. When the second control signal S1311[b] is at a first logic level (such as a logic low level), the P-type transistor Ms5 connects the node VH to the supply voltage VDD according to the ground voltage GND, and the N-type transistor Ms6 connects the node VL to the ground voltage GND according to the supply voltage VDD. Since the P-type transistor Ms5 and the N-type transistor Ms6 are not ideal switches, the voltages Vh and Vl of the nodes VH and the node VL are respectively approximate but not equal to the supply voltage VDD and the ground voltage GND. In addition, when the driver 1312 operates in the VML mode, the inverted enable signal ENB is configured to be a high logic level to turn off the P-type transistors Ms1 and Ms2, and the enable signal EN is a low logic level to turn off the N-type transistors Ms3 and Ms4. In the VML mode, the connection between the non-inverting input terminal of the operational amplifier 30 and the reference voltage VREF is cut off, and the connection between the resistors Rs1 and Rs2 and the output terminals TDP and TDN is cut off. So that the connection between the operational amplifier 30, the resistors Rs1 and Rs2, and the slice unit 300 is cut off, the operational amplifier 30 and the resistors Rs1 and Rs2 do not affect the operation of slice unit 300. Therefore, when the driver 1312 operates in the VML mode, the slice unit 300 may be equivalent to the slice unit 500 shown in FIG. 5. The slice unit 500 operating in the VML mode generates a differential output signal TXOUT between the output terminals TDP and TDN based on the received input signal D and inverted input signal DB.

According to an embodiment of the invention, the output terminals TDP and TDN are coupled to all of the parallel slice units of the driver 1312 to generate differential output signals TXOUT. Specifically, the voltage differences between the output terminals TDP and TDN may be taken as the differential output signal TXOUT.

According to the above embodiment, the driver 1312 of the present invention is selectively operable in two different modes. In the cases that it is guaranteed the output impedance of the driver 1312 is equal to the external characteristic impedance, when the driver 1312 operates in the VML mode, the amplitude of the differential output signal TXOUT is (Vh−Vl)/2, when the driver 1312 operates in the LVDS mode, the amplitude of the differential output signal TXOUT is I/2*(Rs1+Rs2), herein I is the current of the current source 40 or current source 41 shown in FIG. 4, and the currents generated by the current source 40 and the current source 41 have the same magnitude and direction.

Figure 6:
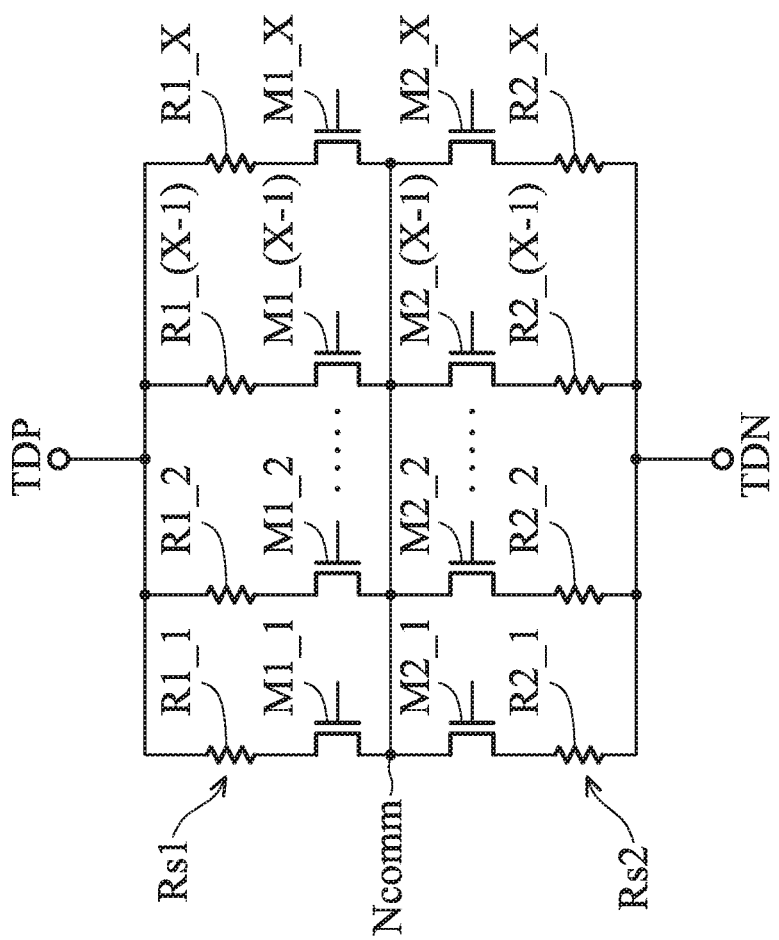
FIG. 6 is a circuit diagram of an adjustable resistor 600 according to an embodiment of the invention.

FIG. 6 is a circuit diagram of the resistor Rs1 and the resistor Rs2 according to an embodiment of the present invention. According to an embodiment of the invention, the resistor Rs1 and the resistor Rs2 are configured to be adjustable and shared by all the slice units of the driver 1312 to adjust the output impedance of the driver 1312 in the LVDS mode, so that the output impedance of the driver 1312 is equal to the external characteristic impedances of the driver 1312. According to another embodiment of the present invention, the resistor Rs1 and the resistor Rs2 are configured to be adjustable and shared by all the slice units of the drivers 1312~13N2 to adjust the output impedance of each of the drivers 1312~13N2 in the LVDS mode, so that the output impedance of each of the drivers 1312~13N2 is equal to the corresponding external characteristic impedance thereof.

Referring to FIG. 6, the resistor Rs1 comprises a plurality of sub-resistors R1_1~R1_x and a plurality of transistors M1_1~M1_x. One sub-resistor and one corresponding transistor are coupled in series between the output terminal TDP and the common mode node Ncomm to form a resistor-switch set, and the resistor-switch sets are coupled in parallel with each other between the output terminal TDP and the common mode node Ncomm. Specifically, in a resistor-switch set of the resistor Rs1, when a transistor, for example, the transistor M1_1, is a P-type transistor, one terminal of the sub-resistor R1_1 corresponding to the transistor M1_1 is coupled to the output terminal TDP, the other terminal of the sub-resistor R1_1 is coupled to the source of the transistor M1_1, the drain of the transistor M1_1 is coupled to the common mode node Ncomm, and the gate of the transistor M1_1 receives a control signal. when a transistor, for example, the transistor M1_1, is an N-type transistor, one terminal of the sub-resistor R1_1 is coupled to the output terminal TDP, the other terminal of the sub-resistor R1_1 is coupled to the drain of the transistor M1_1, the source of the transistor M1_1 is coupled to the common mode node Ncomm, and the gate of the transistor M1_1 receives a control signal. Therefore, the on/off states of the transistors M1_1~M1_x may be controlled by a set of control signals, so that the number of sub-resistors R1_1~R1_x coupled in parallel with each other may be controlled, thereby the resistance value of the resistor Rs1 may be changed. The resistor Rs2 comprises a plurality of sub-resistors R2_1~R2_x and a plurality of transistors M2_1~M2_x. One sub-resistor and one corresponding transistor are coupled in series between the common mode node Ncomm and the output terminal TDN to form a resistor-switch set, and the resistor-switch sets are coupled in parallel with each other between the common mode node Ncomm and the output terminal TDN. Specifically, in a resistor-switch set of the resistor Rs2, when a transistor, such as the transistor M2_1, is a P-type transistor, the source of the transistor M2_1 is coupled to a common mode node Ncomm, the gate of the transistor M2_1 receives a control signal, the drain of the transistor M2_1 is coupled to one terminal of the sub-resistor R2_1, and the other terminal of the sub-resistor R2_1 is coupled to the output terminal TDN. When a transistor, for example, the transistor M2_1, is an N-type transistor, the drain of the transistor M2_1 is coupled to the common mode node Ncomm, the gate of the transistor M2_1 receives a control signal, the source of the transistor M2_1 is coupled to one terminal of the sub-resistor R2_1, and the other terminal of the sub-resistor R2_1 is coupled to the output terminal TDN. Therefore, the on/off states of the transistors M2_1~M2_x may be simultaneously controlled by one set of control signals, so that the number of sub-resistors R2_1~R2_x coupled in parallel with each other may be controlled, thereby the resistance value of the resistor Rs2 may be changed. According to an embodiment of the invention, the transistors M1_1~M1_x and the transistors M2_1~M2_x are all P-type transistors or are all N-type transistors, and the type of the transistors M1_1~M1_x and the transistors M2_1~M2_x is determined by the magnitude of the voltage of the common mode node Ncomm. According to an embodiment of the invention, the number of resistor-switch sets in the resistor Rs1 is equal to the number of resistor-switch sets in the resistor Rs2.

Figure 7:
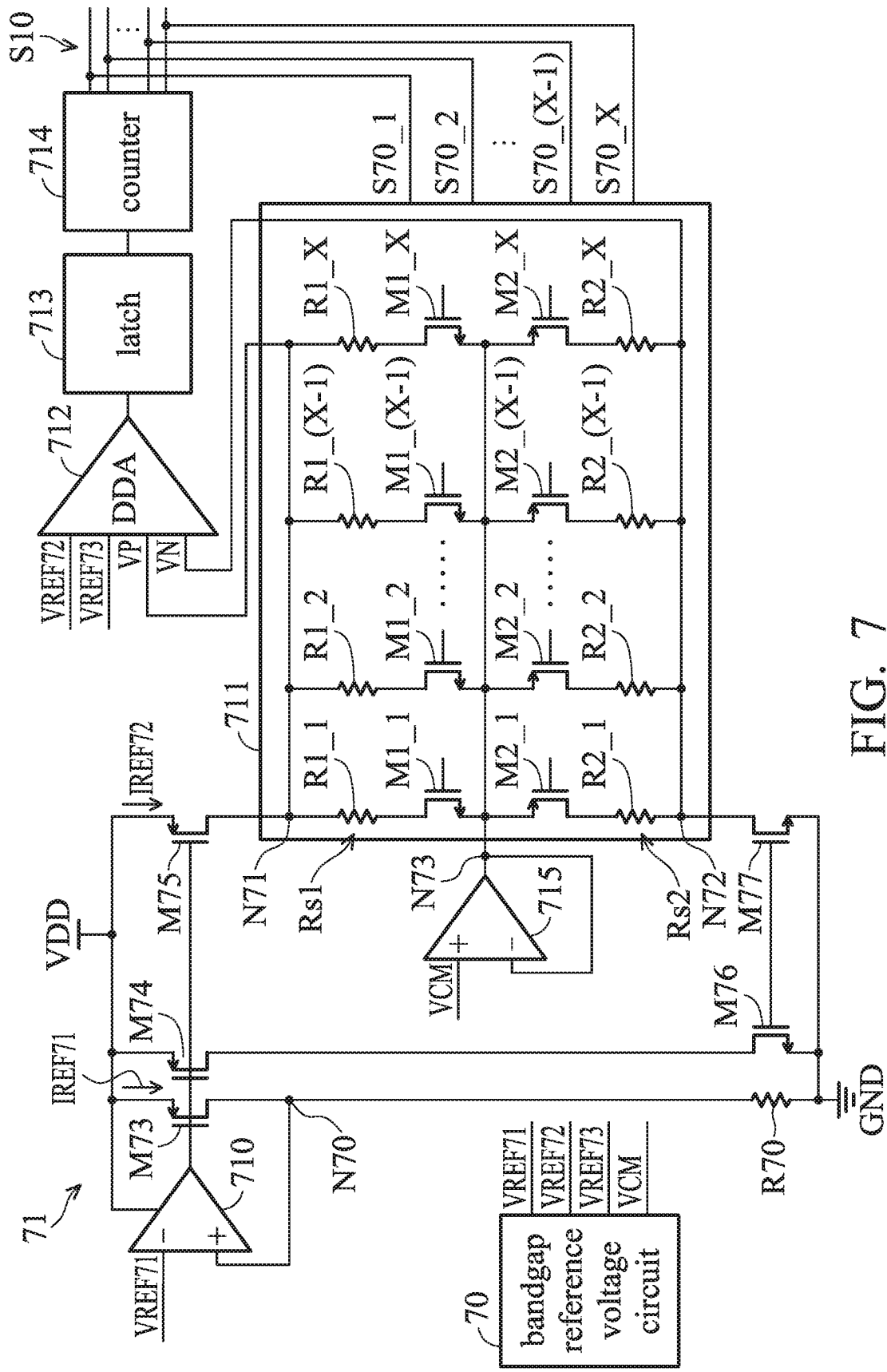
FIG. 7 is a circuit diagram of a first resistance adjusting circuit 10 according to an embodiment of the invention.

FIG. 7 is a circuit diagram of the first resistance adjusting circuit 10 according to an embodiment of the present invention. In order to make the output impedance of the driver 1312 equal to the external characteristic impedance of the driver 1312, the resistance adjusting signal S10 is generated by the first resistance adjusting circuit 10 to adjust the resistance values of the resistors Rs1 and Rs2 of the driver 1312, thereby adjusting the output impedance of the lower driver 1312 in the LVDS mode.

As shown in FIG. 7, the first resistance adjusting circuit 10 comprises a bandgap reference voltage circuit 70 and a resistance controller 71. The resistance controller 71 comprises an operational amplifier 710, a differential difference amplifier (DDA) 712, a latch 713, a counter 714, an operational amplifier 715, transistors M73~M77, and a resistor R70. In order to clearly explain the operation of the first resistance adjusting circuit 10, FIG. 7 also shows the resistor Rs1 and the resistor Rs2 of FIG. 6. For convenience of description, in FIG. 7, the resistor Rs1 and the resistor Rs2 are collectively named as a variable resistance circuit 711. However, it should be noted that the resistors Rs1 and Rs2 of the variable resistance circuit 711 are the objects adjusted by the first resistance adjusting circuit 10, not the components of the first resistance adjusting circuit 10.

As shown in FIG. 7, the bandgap reference voltage circuit 70 generates reference voltages VREF71~VREF73 and a reference voltage VCM. The operational amplifier 710 is powered by the supply voltage VDD. The inverting input terminal of the operational amplifier 710 receives the reference voltage VREF71, and the non-inverting input terminal of the operational amplifier 710 is coupled to a node N70. The source of the P-type transistor M73 receives the supply voltage VDD, the drain of the P-type transistor M73 is coupled to the node N70, and the gate of the P-type transistor M73 is coupled to the output terminal of the operational amplifier 710. One terminal of the resistor R70 is coupled to the node N70, and the other terminal of the resistor R70 is coupled to the ground voltage GND. The source of the P-type transistor M74 receives the supply voltage VDD, the drain of the P-type transistor M74 is coupled to the drain of the transistor M76, and the gate of the P-type transistor M74 is coupled to the output terminal of the operational amplifier 710. The drain of the N-type transistor M76 is coupled to the drain of the P-type transistor M74, the source of the N-type transistor M76 receives the ground voltage GND, and the gate of the N-type transistor M76 is coupled to the gate of the N-type transistor M77. The source of the P-type transistor M75 receives the supply voltage VDD, the drain of the P-type transistor M75 is coupled to a node N71, and the gate of the P-type transistor M75 is coupled to the output terminal of the operational amplifier 710. The variable resistance circuit 711 is coupled between the nodes N71 and N72. The drain of the N-type transistor M77 is coupled to the node N72, the source of the N-type transistor M77 receives the ground voltage GND, and the gate of the N-type transistor M77 is coupled to the gate of the N-type transistor M76.

The on/off states of the transistors M1_1~M1_x are controlled by control signals S70_1~S70_x respectively, so that the number of resistance-switch sets coupled in parallel with each other is controlled, thereby the resistance value of the resistor Rs1 is changed. The on/off states of the transistors M2_1~M2_x are controlled by the control signals S70_1~S70_x, so that the number of sub-resistors coupled in parallel with each other is controlled, thereby the resistance value of the resistor Rs2 is changed.

According to an embodiment of the invention, the operational amplifier 715 is the operational amplifier 30 shown in FIGS. 3 and 4, the operational amplifier 715 may be shared by all of the slice units of the driver 1312. In some embodiments, the operational amplifier 715 may be shared by all of the slice units of the drivers 1312~131N. The non-inverting input terminal of the operational amplifier 715 receives the reference voltage signal VCM, the inverting input terminal and the output terminal of the operational amplifier 715 are coupled to the common mode node N73. Herein, the reference voltage VCM is the aforementioned reference voltage VREF, the node N71 is the aforementioned output terminal TDP, the common mode node N73 is the aforementioned common mode node Ncomm, and the node N72 is the aforementioned output terminal TDN. Referring to FIG. 7, when some transistors of the resistors Rs1 and Rs2 are turned on, a reference current IREF71 is generated according to the reference voltage VREF71 through the operational amplifier 710, the P-type transistor M73, and the resistor R70. A current mirror circuit composed of transistors M73~M77 generates a reference current IREF72 according to the reference current IREF71. The reference current IREF72 flows through the turned-on resistor-switch sets, such that voltages VP and VN are generated at the nodes N71 and N72 respectively.

The differential difference amplifier (DDA) 712 receives reference voltages VREF72 and VREF73, the voltage VP, and the voltage VN for amplifying the difference between the difference of the reference voltages VREF72 and VREF73 (VREF72−VERF73) and the difference of the voltage VP and the voltage VN (VP−VN). The latch 713 latches the output of the differential difference amplifier (DDA) 712 to convert the output of the differential difference amplifier (DDA) 712 into a digital signal, and outputs the digital signal to the counter 714. The counter 714 counts the digital signal from the counter 713 and generates a set of control signals S70_1~S70_$x$ according to the counting result. The set of control signals S70_1~S70_$x$ are supplied to the resistor Rs1 and the resistor Rs2 to control the on/off states of the transistors M1_1~M1_$x$ and the transistors M2_1~M2_$x$, thereby changing the resistance values of the resistors Rs1 and Rs2. For example, the control signal S70_1 controls the transistors M1_1 and M2_1, and the control signal S70_2 controls the transistors M2_2 and M2_2.

According to an embodiment of the invention, the type of the transistors M1_1~M1_$x$ and the transistors M2_1~M2_$x$ is determined according to the voltage of the common mode node N73 and the voltages of the control signals S70_1~S70_$x$. That is, the type of the transistors M1_1~M1_$x$ and the transistors M2_1~M2_$x$ is selected according to the reference voltage VCM and the control signals S70_1~S70_$x$. Specifically, in the cases that the gate-source voltage difference Vgs of the N-type transistor or the source-gate voltage difference Vsg of the P-type transistor is greater than the threshold voltage Vth of the N-type or P-type transistor, the transistor type with lower voltage requirement of the voltage of the common mode node N73 is preferably used. That is, the selection of the transistor type is based on a lower voltage requirement of the voltage VCM to reduce overall power consumption. For example, when Vth is 0.7V, VCM is 0.6V, and the control signals S70_1~S70_$x$ with a high voltage state are 1.8V, the transistors M1_1~M1_$x$ and the transistors M2_1~M2_$x$ are preferably implemented by N-type transistors. When VCM is 1.2V and the control signals S70_1~S70_$x$ with the high voltage state are 1.8V, the transistors M1_1~M1_$x$ and the transistors M2_1~M2_$x$ are preferably implemented by the P type transistors.

According to an embodiment of the invention, any one sub-resistor of the resistor Rs1 may be configured as a normally-on resistor, or any one sub-resistor of the resistor Rs2 may be configured as a normally-on resistor, wherein the transistor corresponding to the sub-resistor configured as a normally-on resistor maintains a normally-on state in the LVDS mode. The configuration of the normally-on resistors may reduce the number of required resistor-switch sets, that is, the value of x is decreased.

According to an embodiment of the invention, the counter 714 is a binary code counter and is preferably equipped with a binary code-thermometer code decoder (not shown), wherein the binary code counter counts the digital signal released by the latch 713 and outputs the counting result to the binary code-thermometer code decoder. The binary code-thermometer code decoder converts the counting result in binary code form into the control signals S70_1~S70_$x$ in thermometer code form. At this time, each of the control signals S70_1~S70_$x$ are used to control one of the resistor-switch sets of the resistor Rs1 and/or one of the resistor-switch sets of the resistor Rs2. The resistor-switch sets of the resistor Rs1 are identical, and the resistor-switch sets of the resistor Rs2 are identical.

According to another embodiment of the present invention, the counter 714 may also be a binary code counter but not equipped with the binary code-thermometer code decoder. The counter 714 may directly output the control signals S70_1~S70_$x$ in binary form. In this situation, the resistor-switch sets of the resistor Rs1 and the resistor Rs2 need to be grouped in a binary form. Specifically, the grouping in the binary form means that the k resistor-switch sets are configured so as to couple one transistor to 1, 2, 4, 8, . . . , $2^{k-1}$ resistors in series respectively. For example, when k=2, the grouping in the binary form means that the two resistor-switch sets in the resistor Rs1 are respectively configured as so to couple one transistor to 1 resistor in series and one transistor to 2 parallel identical resistors in series, and two resistor-switch sets in resistor Rs2 are configured so as to couple one transistor to 1 resistor in series and one transistor to 2 parallel identical resistors in series respectively. At this time, less bits of the control signals S70_1~S70_$x$ are required to control the resistor Rs1 and the resistor Rs2. For example, when 40-bit thermometer-code control signals S70_1~S70_40 are required to control 40 resistor-switch sets of the resistor Rs1 and 40 resistor-switch sets of the resistor Rs2, only 6-bit binary-code control signals S70_1~S70_6 are required to control 6 resistor-switch sets of the resistor Rs1 and 6 resistor-switch sets of the resistor Rs2. Therefore, directly using the binary counter 714 and performing the grouping in the binary form on the resistor Rs1 and the resistor Rs2 may greatly reduce the bits number of required control signals S70_1~S70_$x$ and reduce the wiring space, but larger glitch may occur during the flips of the binary-code control signals S70_1~S70_$x$.

According to the above, when the driver 1312 operates in the LVDS mode, the present invention adjusts the magnitudes of the resistors Rs1 and Rs2 through the control signals S70_1~S70_$x$ generated by the resistance controller 71, so as to adjust the output impedance of the driver 1312 in the LVDS mode, herein the resistors Rs1 and Rs2 are shared by each of the slice units. According to an embodiment of the invention, the first resistance adjusting signal S10 outputted by the first resistance adjusting circuit 10 shown in FIG. 7 has a plurality of bits, and the control signals S70_1~S70_X are obtained from the plurality of bits, for example, the first X bits.

Figure 8:
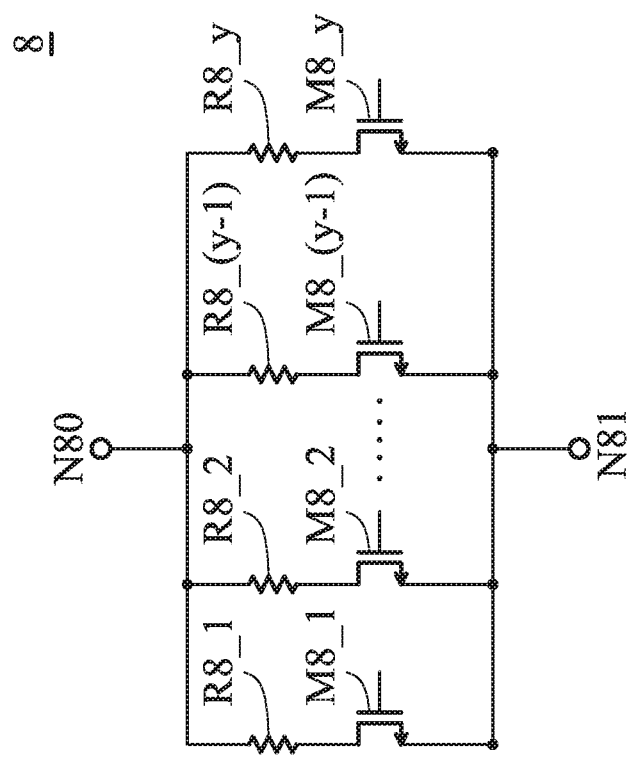
FIG. 8 is a circuit diagram of an adjustable resistor 800 according to an embodiment of the invention.

FIG. 8 is a circuit diagram of the adjustable replicated resistor 800 in the VML mode according to an embodiment of the invention. In the embodiment of FIG. 3, the resistors Rpn, Rpp, Rnn, and Rnp are fixed resistors and are substantially identical in structure, and have the same resistance value, that is, the resistors Rpn, Rpp, Rnn, and Rnp are the same and not adjustable, and thus, the resistor 800 is configured. Each of the sub-resistors R8_1~R8_y included in the resistor 800 is configured by replicating the resistor Rpn or Rpp or Rnn or Rnp shown in FIG. 5. The resistor 800 is coupled between nodes N80 and N81. One of the sub-resistors R8_1~R8_y and a corresponding N-type transistor of N-type transistors M8_1~M8_y are coupled in series between the nodes N80 and N81 to form a resistor-switch set, and the plurality of resistor-switch sets are coupled in parallel with each other between the nodes N80 and N81. Herein, one terminal of each of the sub-resistors R8_1~R8_y is coupled to the node N80, and the other terminal of each of the sub-resistors R8_1~R8_y is coupled to the drain of the corresponding one of the N-type transistors M8_1~M8_y. The gate of each of the transistors M8_1~M8_y receives a one-bit control signal. The sources of the transistors M8_1~M8_y are coupled to the node N81. In the present invention, the on/off states of the N-type transistors M8_1~M8_y are controlled by a set of control signals included in the second resistance adjusting signal S11 to control the number of sub-resistors R8_1~R8_y coupled in parallel with each other, thereby changing the resistance value of the resistor 800.

Figure 9:
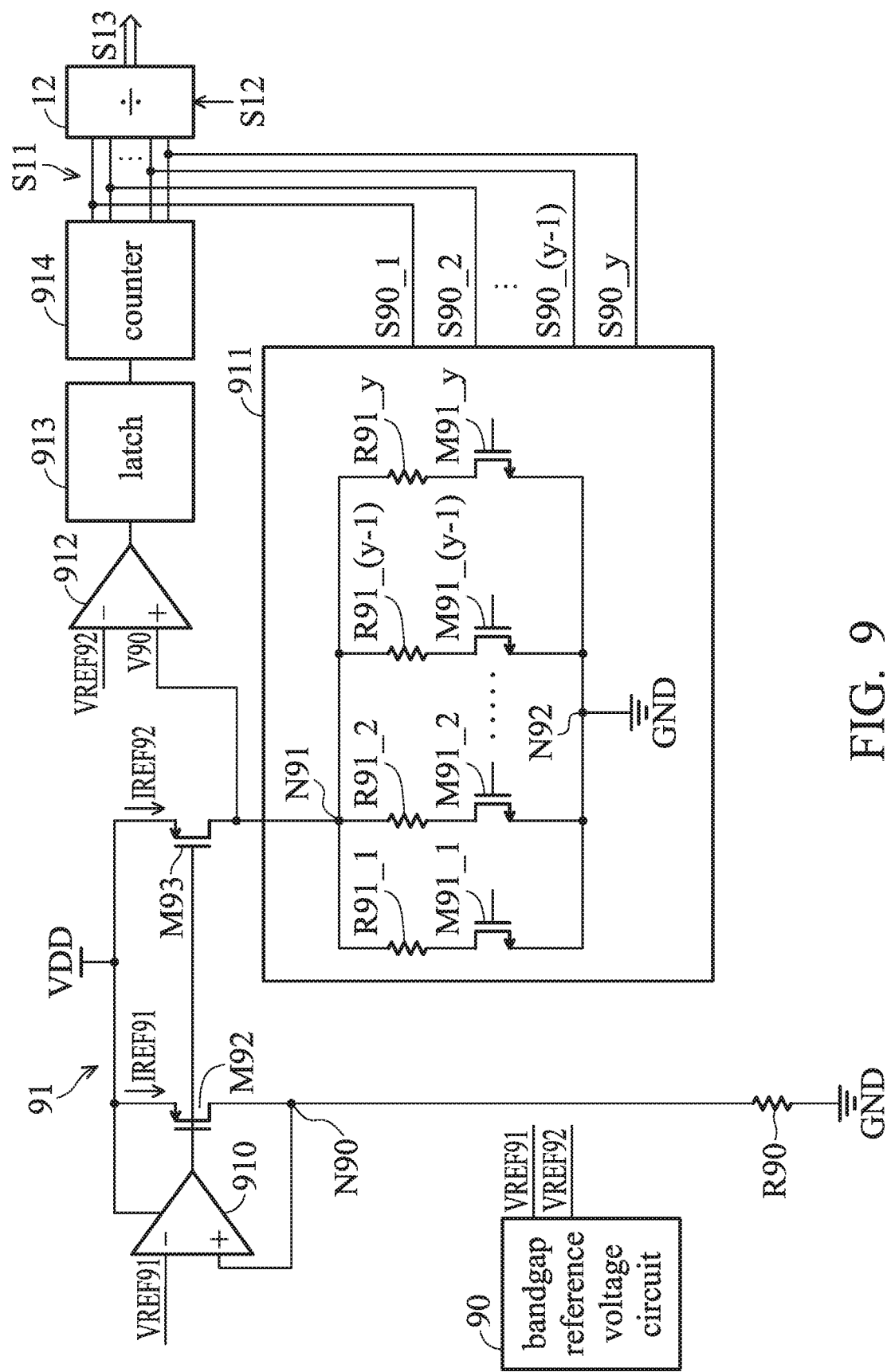
FIG. 9 is a circuit diagram of a second resistance adjusting circuit 11 according to an embodiment of the invention.

FIG. 9 is a circuit diagram of the second resistance adjusting circuit 11 in the VML mode according to an embodiment of the present invention. The second resistance adjusting circuit 11 generates the correct second resistance adjusting signal S11. As shown in FIG. 9, the second resistance adjusting circuit 11 comprises a band-gap reference circuit 90 and a resistance controller 91. The resistance controller 91 comprises an operational amplifier 910, a resistor 911, a comparator 912, a latch 913, a counter 914, P-type transistors M92 and M93, and a resistor R90. The band-gap reference circuit 90 generates accurate reference voltages VREF91 and VREF92. The operational amplifier 910 is powered by the supply voltage VDD. The inverting input terminal of the operational amplifier 910 receives the reference voltage VREF91, and the non-inverting input terminal of the operational amplifier 910 is coupled to a node N90. The source of the P-type transistor M92 receives the supply voltage VDD, the drain of the P-type transistor M92 is coupled to the node N90, and the gate of the P-type transistor M92 is coupled to the output terminal of the operational amplifier 910. One terminal end of the resistor R90 is coupled to the node N90, and the other terminal of the resistor R90 is coupled to the ground voltage GND. The source of the P-type transistor M93 receives the supply voltage VDD, the drain of the P-type transistor M93 is coupled to a node N91, and the gate of the P-type transistor M93 is coupled to the output terminal of the operational amplifier 910. In order to clearly explain the operation of the second resistance adjusting circuit 11, FIG. 9 also shows the divider 12 of FIG. 1.

The resistor 911, that is the aforementioned adjustable replicated resistor 800, is a portion of the resistance controller 91. The resistor 911 is coupled between the nodes N91 and N92, herein the node N92 receives the ground voltage GND. The resistor 911 includes a plurality of sub-resistors R91_1~R91_y and a plurality of N-type transistors M91_1~M91_y. One sub-resistor and one corresponding N-type transistor are coupled in series between the nodes N91 and N92 to form a resistor-switch set, and the plurality of resistor-switch sets are coupled in parallel with each other between the nodes N91 and N92. The on/off states of the N-type transistors M91_1~M91_y are controlled by the control signals S90_1~S90_y respectively, so that the number of resistor-switch sets coupled in parallel is controlled, thereby the resistance value of the resistor 911 is changed/adjusted.

Referring to FIG. 9, it is assumed that some transistors of the resistor 911 are turned on. The operational amplifier 910, the P-type transistor M92, and the resistor R90 operate and generate a reference current IREF91 according to the reference voltage VREF91. A current mirror circuit composed of the transistors M92 and M93 generates a reference current IREF92 based on the reference current IREF91. The reference current IREF92 flows through the resistor-switch sets of the resistor 911 which are turned on by the corresponding N-type transistors, such that a voltage V90 is generated at the node N91. The comparator 912 receives the reference voltage VREF9 and the voltage V90 of the node N91 and compares the reference voltages VREF9 with the voltage V90. The latch 913 converts the comparison result output from the comparator 912 into a digital signal. The counter 914 performs a counting operation according to the digital signal from the latch 913 and generates the control signals S90_1~S90_y according to the counting result to control the on/off states of the N-type transistors M91_1~M91_y to change the resistance value of the resistor 911. For example, the N-type transistor M91_1 is controlled by the control signal S90_1, and the N-type transistor M91_2 is controlled by the control signal S90_2.

According to an embodiment of the present invention, similar to the counter 714 shown in FIG. 7, the counter 914 is a binary code counter and is preferably equipped with a binary code-thermometer code decoder (not shown). According to another embodiment of the invention, the counter 914 may also be a binary code counter but not equipped with any binary code-thermometer code decoder.

According to an embodiment of the invention, the second resistance adjusting signal S11 output by the second resistance adjusting circuit 11 shown in FIG. 9 has a plurality of bits, and the control signals S90_1~S90_y are obtained from the plurality of bits, for example, the first y bits. The counter 914 outputs the control signals S90_1~S90_y to the divider 12. The divider 12 divides the signal S90 whose data bits are the control signals S90_1~S90_y by the standard value S12 to generate and output the first control signal S13. The standard value S12 is also referred to as a standard value SLICE and represents a default binary parameter of the TT process corner.

According to an embodiment of the invention, when the counter 914 is a binary code counter and is equipped with a binary code-thermometer code decoder, a thermometer code-binary code decoder is correspondingly configured for the divider 12, and the thermometer code-binary code decoder performs transcoding processing to the first control signal S13. According to another embodiment of the present invention, when the counter 914 is a binary code counter but not equipped with any binary code-thermometer code decoder, the counter 914 directly outputs the second resistance adjusting signal S11 in the binary form, without additionally configuring a thermometer code-binary code decoder for the divider 12, the divider 12 directly outputs the first control signal S13.

For the VML mode, matching with external characteristic impedance may be achieved by controlling the number of slice units coupled in parallel of the driver 1312. The plurality of sub-resistors R91_1~R91_y coupled in parallel of the resistor 911 shown in FIG. 9 are configured by replicating from the slice units, so that when a first number of the sub-resistors R91_1~R91_y are turned on, the correct second resistance adjusting signal S11 may be obtained to obtain the correct first control signal S13, such that the first number of the slice units turned on for achieving the matching with the external impedance. The second resistance adjusting signal S11 output to the divider 12 may be used to control the output impedance of the driver 1312 to match with the external characteristic impedance. But when the differential output signal TXOUT output by the driver 1312 needs to transmit through a channel, it is unable to resist the channel attenuation to the differential output signal TXOUT, and further unable to satisfy the request for the equalization (EQ) amplitude of the differential output signal TXOUT. According to an embodiment of the invention, the equalization amplitude, hereinafter referred to as EQ amplitude, is used to compensate for signal attenuation caused by channel transmission. The detail will be described in detail below.

FIGS. 10A and 10B respectively illustrate a waveform state of the differential serial signals D[0]~D[m] and DB[0]~DB [m] at the TX terminal of the lane 131 and illustrate the waveform states received by the RX terminal after the differential serial signal D[0]~D[m] and DB[0]~DB [m] passes through the channel of the lane 131. As shown in FIG. 10A, the amplitudes of the signals with different frequencies are the same. However, to the higher frequency signal, the attenuation generated by the channel is greater. Accordingly, as shown in FIG. 10B, after the signal is transmitted through the channel, the waveform of the signal received by the RX terminal indicates that lower frequency signals have larger amplitudes and higher frequency signals have lower amplitudes.

Figures 11A, 11B, 11C:
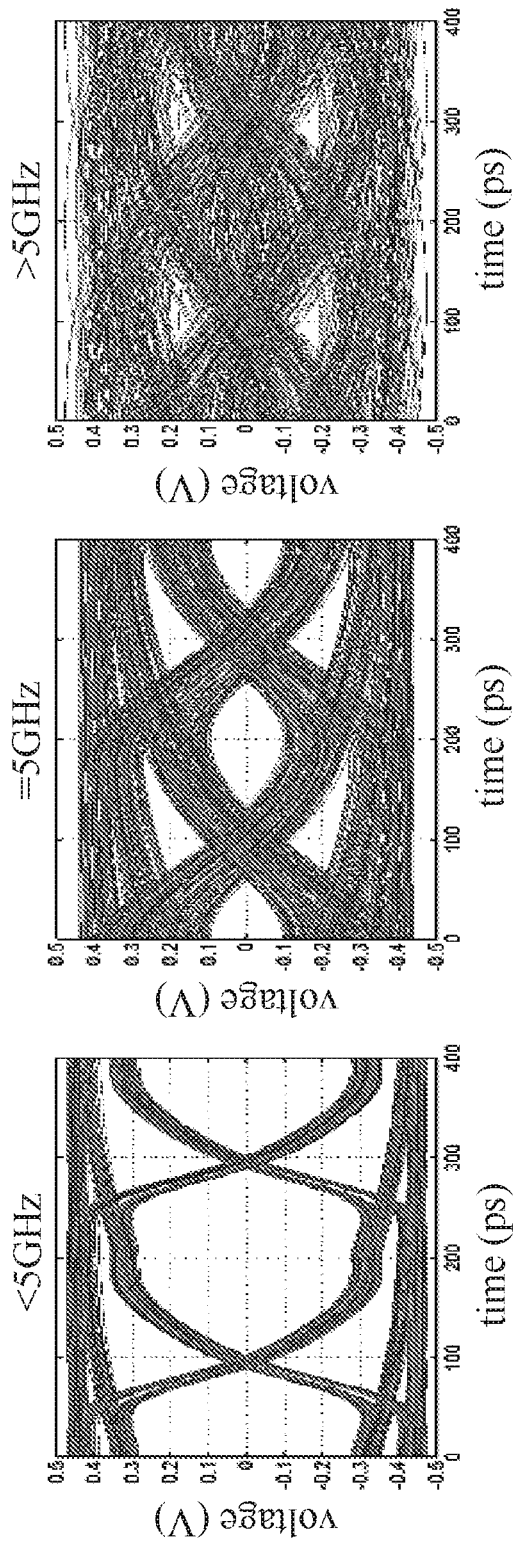
FIGS. 11A-11C are eye diagrams of an output signal according to an embodiment of the present invention.

FIGS. 11A-11C show eye patterns formed by superimposing signal waveforms received at the RX terminal shown in FIG. 10B. As shown in FIGS. 11A-11C, when the frequency of the differential serial signals D[0]~D[m] and DB[0]~DB [m] shown in FIG. 10 is higher, the attenuation to these differential serial signals generated by the channel is greater, such that the amplitudes of the signals received by the RX terminal are smaller, the open area of the eye patterns is smaller, and the bit error rate is higher. Therefore, it is necessary to perform equalization processing to the differential serial signals D[0]~D[m] and DB[0]~DB [m] at the TX terminal. For the present invention, the equalization processing in the VML mode may be performed by the slice units of the driver 1311.

Figure 12A:
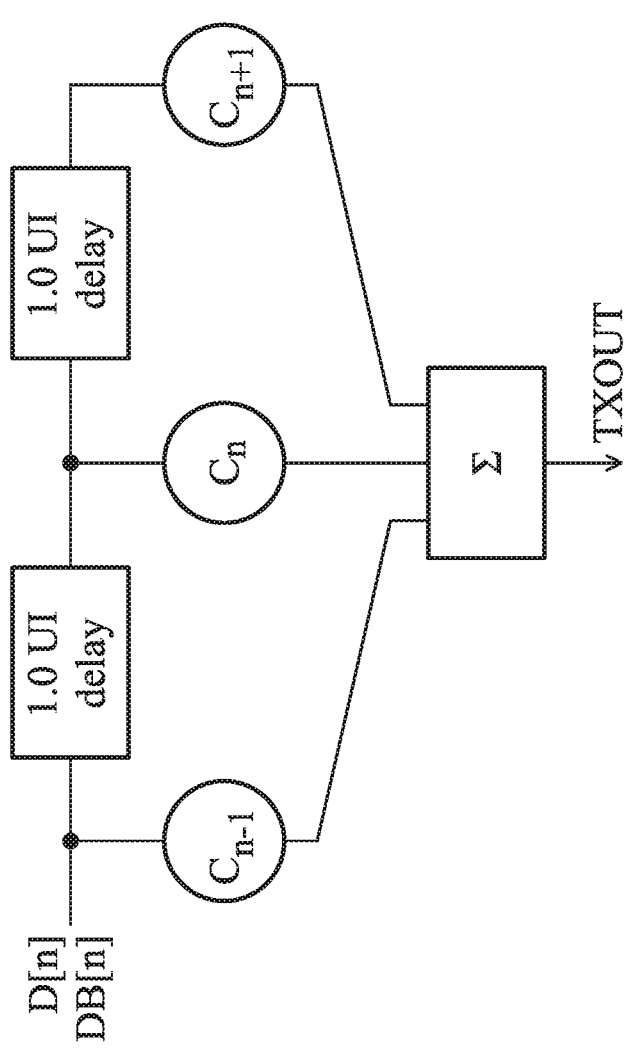
FIGS. 12A-12B are schematic diagrams showing suppression of channel attenuation according to an embodiment of the present invention.

FIG. 12A showing the 3-tap finite impulse response (FIR) of the equalization processing performed to the differential serial signals D[0]~D[m] and DB[0]~DB [m] of the driver 1312. As shown in FIG. 12A, the finite impulse response is applied to obtain the sum of the product of the previous bit D[n−1] and the equalization coefficient $C_{n-1}$, the product of the current bit D[n] and the equalization coefficient $C_n$, and the product of the next bit D[n+1] and the equalization coefficient $C_{n+1}$. Similarly, the finite impulse response is applied to obtain the sum of the product of the previous DB[n−1] and the equalization coefficient $C_{n-1}$, the product of the current bit DB[n] and the equalization coefficient $C_n$, and the product of the next bit DB[n+1] and the equalization coefficient $C_{n+1}$. Thus, the differential output signal TXOUT is obtained finally. The sum of the absolute values of the equalization coefficients $C_{n-1}$, $C_n$, and $C_{n+1}$ is 1. Except for the equalization coefficient $C_n$, the other equalization coefficients, such as $C_{n-1}$ and $C_{n+1}$, are less than or equal to zero.

There is a delay of a unit interval (UI) between D[n−1] and D[n], between D[n] and D[n+1], between DB[n−1] and DB[n], and between DB[n] and DB[n+1].

Figure 12B:
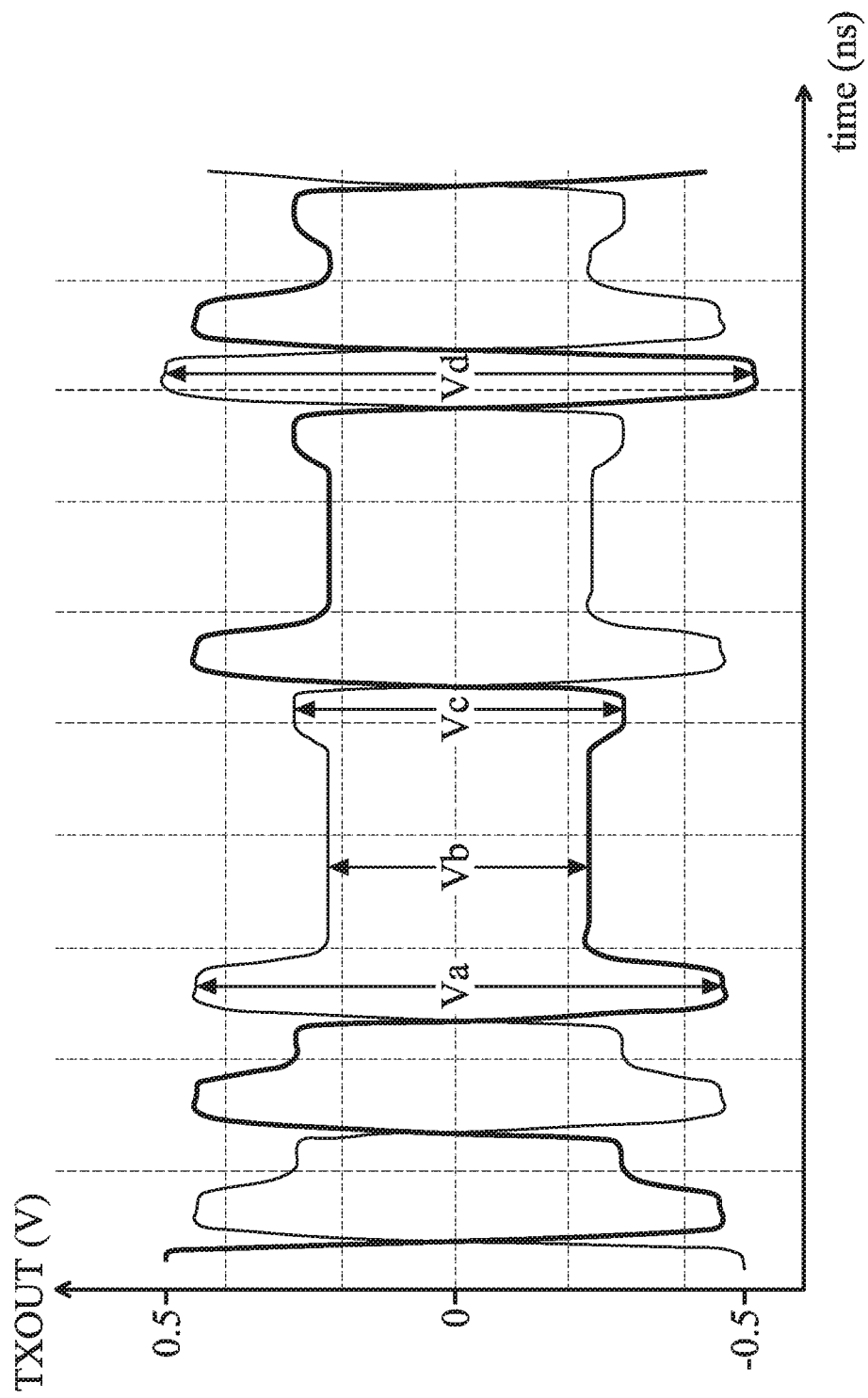

FIG. 12B showing the waveform of the differential output signal TXOUT after the equalization processing performed to the driver 1312 according to an embodiment of the present invention. As shown in FIG. 12B, the equalization processing may make the differential output signal TXOUT have a characteristic that a higher frequency signal has a larger amplitude and a lower frequency signal has a smaller amplitude. This characteristic is opposite to the characteristic of the attenuation generated by the channel to signals shown in FIG. 10B. These two characteristics may compensate each other, thus, the amplitudes of the signals received at the RX terminal in lane 131 may tend to be stable.

The extent that the differential output signal TXOUT needs to be compensated to against the attenuation generated by the channel is represented by the EQ amplitude. The EQ amplitude is equivalent to the ratio of the voltage amplitudes between two different pulse widths of the differential output signal TXOUT. For example, the pre-emphasis amplitude Preshoot, the de-emphasis amplitude De-emphasis, and the main amplitude Boost may be expressed as:

Preshoot=20 $\log_{10} Vc/Vb$

De-emphasis=20 $\log_{10} Vb/Va$

Boost=20 $\log_{10} Vd/Vb$

There are following relationships between the above equalization coefficients and the pre-emphasis amplitude Preshoot, the de-emphasis emphasis, and the main amplitude Boost:

$$\text{Preshoot} = 20\log_{10} \frac{C_n - |C_{n+1}| + |C_{n-1}|}{C_n - |C_{n+1}| - |C_{n-1}|}$$

$$\text{De-emphasis} = 20\log_{10} \frac{C_n - |C_{n+1}| - |C_{n-1}|}{C_n + |C_{n+1}| - |C_{n-1}|}$$

$$\text{Boost} = 20\log_{10} \frac{C_n + |C_{n+1}| + |C_{n-1}|}{C_n - |C_{n+1}| - |C_{n-1}|}$$

According to an embodiment of the invention, the compensation for the attenuation generated by the channel may not be completed at one time, and the attenuation may be compensated for at least once at the transmitting terminal or at least once at the receiving terminal, or at least once at the transmitting terminal and receiving terminal. Of course, the number of taps of the finite impulse response of the present invention is not limited to 3-tap, and 2-tap, 4-tap, etc., the number of taps is determined according to the attenuation of the signal caused by the channel.

Therefore, according to an embodiment of the present invention, in addition to the divider 12 configured in the driving system 100, the second controller 1311 needs to be configured in the lane 131 to adjust the number of turned-on slice units coupled in parallel of the driver 1312 in conjunction with the first control signal S13. The second controller 1311 controls the input of each slice unit for simultaneously satisfying the requirements of adjusting the output impedance of the driver 1312 and adjusting the equalization amplitude of the differential output signal TXOUT.

According to the above, when the driver 1312 operates in the VML mode, the first control signal S13 generated by the divider 12. The first control signal S13 is generated for adjusting the output impedance of the driver 1312 in the VML mode and adapting the differential output signal TXOUT to the demand for the EQ amplitude.

Figure 13:
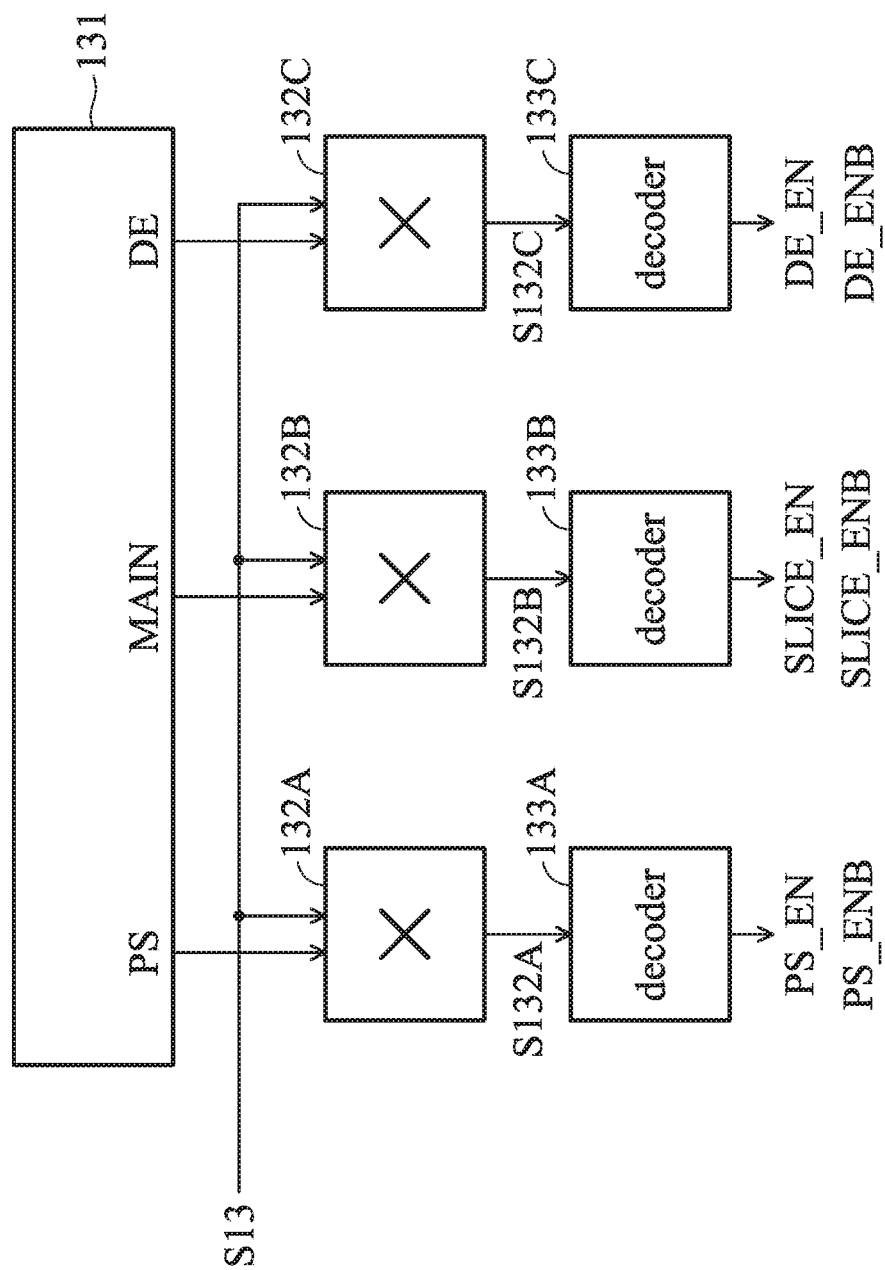
FIG. 13 is a schematic diagram showing a second controller 1311 according to an embodiment of the invention.

FIG. 13 is a diagram showing the second controller 1311 according to an embodiment of the present invention. Referring to FIG. 13, the second controller 1311 comprises a register 131 for storing equalization parameters related to the EQ amplitude. FIG. 13 illustrates three equalization parameters (3-tap FIR), herein the three equalization parameters are the pre-emphasis value PS, the main value MAIN, and the de-emphasis value DE. According to an embodiment of the invention, which equalization parameters are selected and what the adjusting range of the signal attenuation of each the equalization parameter is depend on the attenuation of the signal caused by the channel. According to an embodiment of the invention, depending on the number of taps of the FIR, 2~4 equalization parameters are generally set to compensate for the attenuation of the signal.

FIG. 13 shows three multipliers 132A~132C. The multipliers 132A~132C respectively read the pre-emphasis value PS, the main value MAIN, and the de-emphasis value DE from the register 131. The multipliers 132A~132C receive the first control signal S13 from the device 12. The multiplier 132A multiplies the pre-emphasis value PS with the first control signal S13 to obtain a value S132A, the multiplier 132B multiplies the main value MAIN with the first control signal S13 to obtain a value S132B, and the multiplier 132C multiplies the de-emphasis value DE with the first control signal S13 to obtain a value S132C.

FIG. 13 shows three decoders 133A~133C. The decoders 133A~133C respectively receive the values S132A~S132C and respectively perform binary-thermometer conversion on the values S132A-S132C, to obtain the second control signal that turns on the first number of the parallel slice units. As shown in FIG. 13, the decoder 133A receives the value S132A and performs the binary-thermometer conversion on the value S132A to obtain a thermometer code PS_EN and/or a thermometer code PS_ENB complementary to the thermometer code PS_EN for turning on a second number of the slice units. The decoder 133C receives the binary code S132C and performs the binary-thermometer conversion on the binary code S132C to obtain a thermometer code DE_EN and/or a thermometer code DE_ENB complementary to the thermometer code DE_EN for turning on a third number of the slice units. The decoder 133B receives the value S132B and performs the binary-thermometer conversion on the binary code S132B to obtain a thermometer code MAIN_EN and/or a thermometer code MAIN_ENB complementary to the thermometer code MAIN_EN for turning on a fourth number of the slice units. According to an embodiment of the present invention, the number of types of the equalization parameters, the number of adders, and the number of multipliers included in the second controller 1311 of the present application may be set to be the same and equal to the number of taps of the FIR, but not limited to, 3. According to another embodiment of the present invention, the number of types of the equalization parameters and the number of multipliers, and the number of decoders are not limited strictly and may be just sufficient for the above-described operations of the multiplication and binary-thermometer conversion.

According to the above description, the thermometer code MAIN_EN and/or MAIN_ENB is obtained through dividing the second resistance adjusting signal S11 by the standard value SLICE, and then multiplying the dividing result by the main value MAIN, so as to turn on the fourth number of the parallel slice units. The thermometer code PS_EN and/or PS_ENB is obtained through dividing the second resistance adjusting signal S11 by the standard value SLICE and then multiplying the dividing result by the pre-emphasis value PS, so as to turn on the second number of the parallel slice units. The thermometer code DE_EN and/or DE_ENB is obtained through dividing the second resistance adjusting signal S11 by the standard value SLICE and then multiplying the dividing result by the de-emphasis value DE, so as to turn on the third number of the parallel slice units. Herein, the second resistance adjusting signal S11 is used to adjust the magnitude of the output impedance. According to an embodiment of the invention, the second control signals S1311 generated and output by the second controller 1311 includes the thermometer code PS_EN and/or the thermometer code PS_ENB, the thermometer code DE_EN and/or the thermometer code DE_ENB, and the thermometer code MAIN_EN and/or the thermometer code MAIN_ENB.

According to an embodiment of the invention, the standard value SLICE corresponds to the first number, the pre-emphasis value PS corresponds to the second number, the de-emphasis value DE corresponds to the third number, and the main value MAIN corresponds to the fourth number. Herein the standard value SLICE is equal to the sum of the pre-emphasis value PS, the de-emphasis value DE, and the main value MAIN, and the first number is equal to the sum of the second number, the third number, and the fourth number.

According to an embodiment of the invention, the pre-emphasis value PS and the de-emphasis value DE are determined by the aforementioned EQ coefficients $C_{n-1}$ and $C_{n+1}$. For example, the number of slice units supporting the maximum PVT (process, voltage, temperature) variation at the TT process corner is the first number, such as 32. The adjustment range of the EQ coefficient $C_{n-1}$ is 0~0.25, and the adjusting range of $C_{n+1}$ is 0~0.33, then 8 (i.e. 32*0.25) slice units are configured for the pre-emphasis operation, and 11 (i.e. 32*0.33) slice units are configured for the de-emphasis operation. The maximum values of the pre-emphasis value PS and the de-emphasis value DE are also proportional to the 8 slices and the 11 slices. For example, the pre-emphasis value PS may vary from 0 to 8 by taking 1 as a step and the de-emphasis value DE may vary from 0 to 11 by taking 1 as a step. For another example, the pre-emphasis value PS may vary from 0 to 0.08 by taking 0.01 as a step and the de-emphasis value DE may vary from 0 to 0.11 by taking 0.01 as a step. However, it is relatively steady that the second number varies between 0 and 8 by taking 1 as a step, and the third number varies between 0 and 11 by taking 1 as a step. The first number is equal to the sum of the second number, the third number, and the fourth number, and thus the fourth number varies between 21 and 32 by taking 1 as a step.

According to an embodiment of the invention, the driver 1312 respectively controls the number of slice units performing the pre-emphasis operation, the number of slice units performing the de-emphasis operation, and the number of slice units not performing the pre-emphasis operation and the de-emphasis operation according to the thermometer code PS_EN and/or the thermometer code PS_ENB, the thermometer code DE_EN and/or the thermometer code DE_ENB, the thermometer code MAIN_EN and/or the thermometer code MAIN_ENB of the second control signals S1311. When the total number of enabled slice units is the first number, the second number, the third number, and the fourth number may be adjusted by adjusting the pre-emphasis value PS, the main value MAIN, and the de-emphasis value DE, thereby achieving the matching with the external resistance and the adjusting of the EQ amplitude. According to an embodiment of the invention, the second number, the third number, and the fourth number are determined by the EQ coefficients, and the optimal EQ coefficients are determined by characteristics of the channel, such as an S parameter in the frequency domain, or an impulse response in the time domain. In general, the indictors, such as attenuation, reflection, crosstalk of signals generated by the channel, the adjusting range of the EQ coefficients that the driver needs to satisfy, and the EQ step of adjusting the EQ coefficients may be obtained from the corresponding communication protocol to determine the above second number, third number, and fourth number.

According to an embodiment of the invention, in the VML mode, the driver 1312 enables the first number of the slice units through the thermometer code PS_EN and/or the thermometer code PS_ENB, the thermometer code DE_EN and/or the thermometer code DE_ENB, the thermometer code MAIN_EN and/or the thermometer code MAIN_ENB of the second control signals. The first number is determined by the external resistance of the driver 1312, the process corner, and the supported maximum PVT variation. By adjusting the total number of turned on slice units to the first number, the matching with the external resistance may be achieved. Correspondingly, the parallel sub-resistors R91_1~R91_$y$ in the resistor 911 shown in FIG. 9 are configured by replicating from each slice unit, when the sub-resistors R91_1~R91_$y$ of the first number are turned on, the correct first control signal S13 may be obtained, thereby turning on the first number of the slice units and achieving the matching with the external characteristic impedance.

Figure 14:
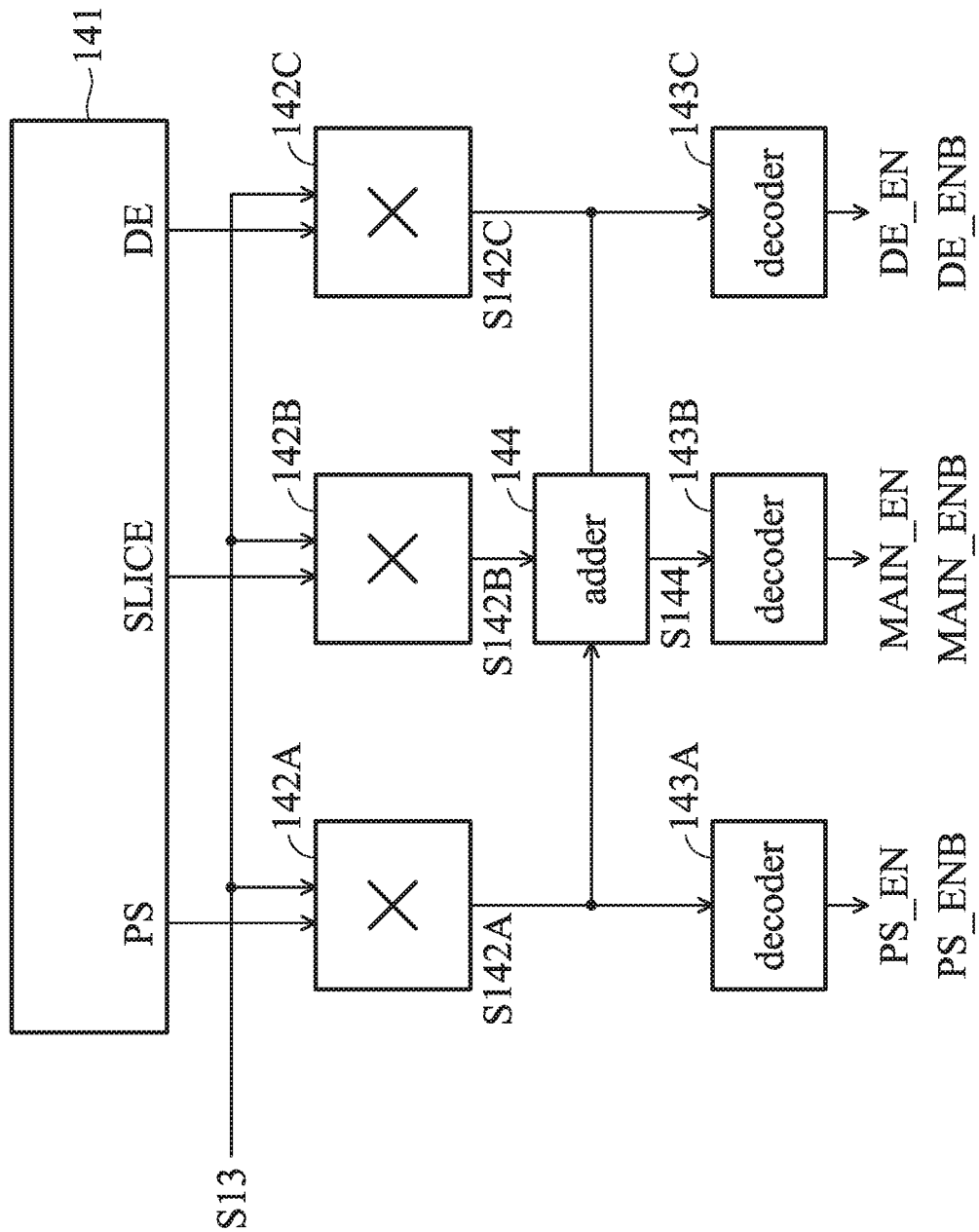
FIG. 14 is a schematic diagram showing a second controller 1311 according to an embodiment of the invention.

FIG. 14 is a schematic diagram showing the second controller 1311 according to another embodiment of the present invention. The different between FIG. 14 and FIG. 13 is that, in FIG. 14, the equalization parameters stored in the register 141 in the second controller 1311 are the pre-emphasis value PS, the standard value SLICE, and the de-emphasis value DE. Multipliers 142A~142C respectively read the pre-emphasis value PS, the standard value SLICE, and the de-emphasis value DE from the register 141. The multipliers 142A~142C receive the first control signal S13 from the divider 12. The multiplier 142A multiplies the pre-emphasis value PS with the first control signal S13 to obtain a value S142A; the multiplier 142B multiplies the standard value SLICE by the first control signal S13 to obtain a value S142B; the multiplier 142C multiplies the de-emphasis value DE with the first control signal S13 to obtain a value S142C. Herein the standard value SLICE is the sum of the pre-emphasis value PS, the main value MAIN and the de-emphasis value DE shown in FIG. 13. Thus, an adder 144 may be configured in the second controller 1311. The adder 144 receives the values S142A, S142B, and S142C output from the multipliers 142A~142C, and subtracts S142A and S142C from the value S142B to obtain a value S144, herein the value S144 may be the same as S132B shown in FIG. 13. A decoder 143A receives the value S142A and performs the binary-thermometer conversion on the value S142A to obtain the thermometer code PS_EN and/or the thermometer code PS_ENB complementary to the thermometer code PS_EN for turning on the second number of the slice units. The decoder 143C receives the binary code S142C and performs the binary-thermometer conversion on the binary code S142C to obtain the thermometer code DE_EN and/or the thermometer code DE_ENB complementary to the thermometer code DE_EN for turning on the third number of the slice units. The decoder 143B receives the value S144 and performs the binary-thermometer conversion on the value S144 to obtain the thermometer code MAIN_EN and/or the thermometer code MAIN_ENB complementary to the thermometer code MAIN_EN for turning on the fourth number of the slice units. According to this embodiment, the second control signals S1311 output by the second controller 1311 includes the thermometer code PS_EN and/or PS_ENB, DE_EN and/or DE_ENB, and MAIN_EN and/or MAIN_ENB to turn on the first number of the slice units.

According to another embodiment of the present invention, in the cases that there are two equalization parameters (2-tap FIR), the two equalization parameters are, for example, a pre-emphasis value PS and a main value MAIN, and then the first number is equal to the sum of the second number and the fourth number. Alternatively, the two equalization parameters are a main value MAIN and a de-emphasis value DE, and then the first number is equal to the sum of the third number and the fourth number.

According to another embodiment of the present invention, in the cases that there are four equalization parameters (4-tap FIR), the four equalization parameters are, for example, a first pre-emphasis value PS1, a second pre-emphasis value PS2, a main value MAIN, and a de-emphasize value DE, and then the first number is equal to the sum of the third number, the fourth number, the seventh number corresponding to the first pre-emphasis value PS1 and the eighth number corresponding to the second pre-emphasis value PS2. Alternatively, the four equalization parameters are a pre-emphasis value PS, a main value MAIN, a first de-emphasis value DE1, and a second de-emphasis value DE2, and then the first number is equal to the sum of the second number, the fourth number, the ninth number corresponding to the first de-emphasis value DE1 and the tenth number corresponding to the second de-emphasis value DE2.

Figure 15:
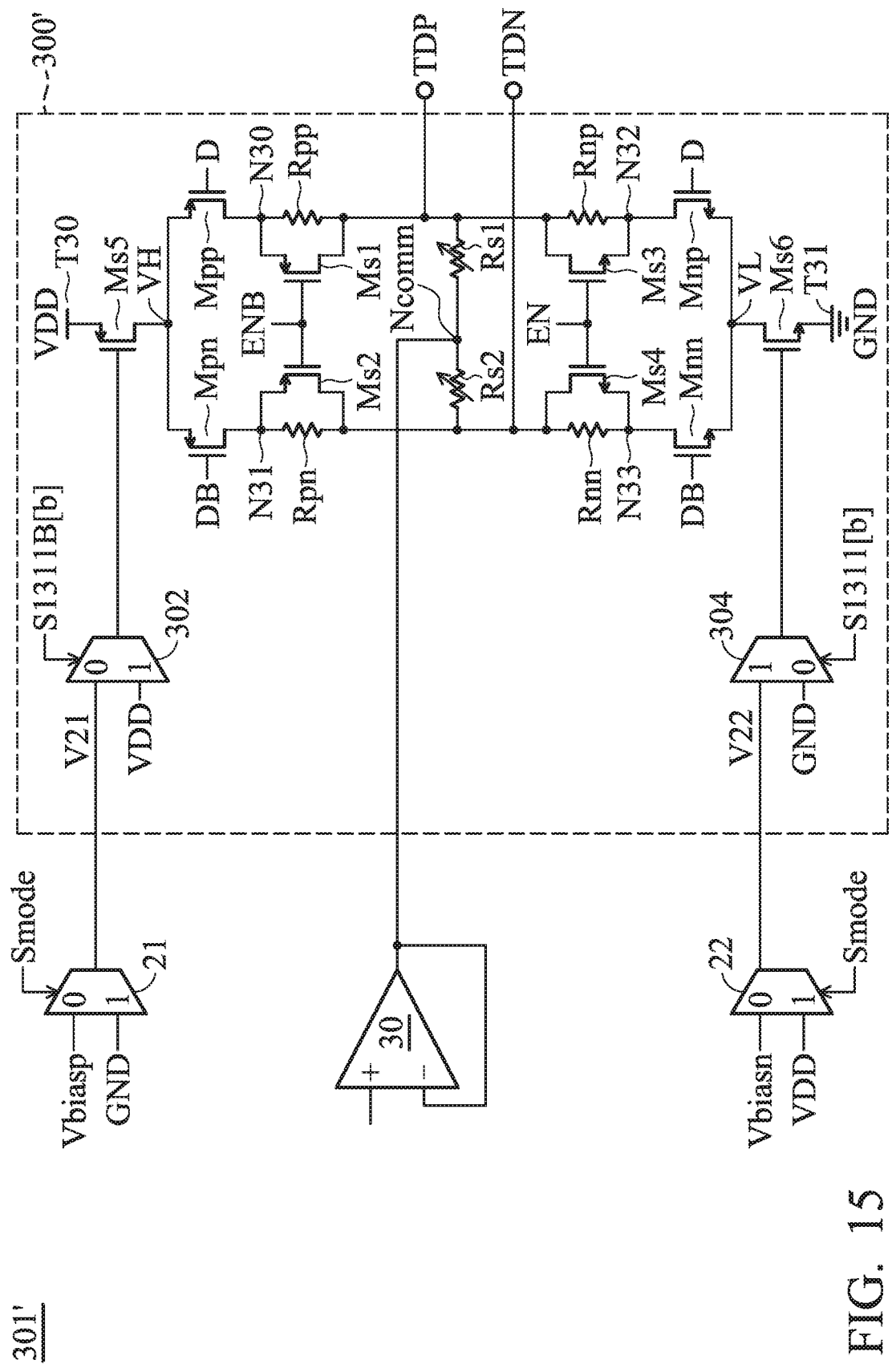
FIG. 15 is a schematic diagram showing a slice module 301' according to an embodiment of the present invention.

FIG. 15 is a schematic diagram showing a slice module 301' according to an embodiment of the invention. The chip device 301' is applicable to the second controller 1311 shown in FIG. 13 or FIG. 14, the slice unit 300' may be used as any of the slice units controlled by the second controller 1311 shown in FIG. 14 or FIG. 15. Compared with the slice unit 300 of FIG. 3, FIG. 15 illustrates the case that the multiplexer 302 and the multiplexer 304 are controlled by a pair of complementary thermometer codes in the slice unit 300'.

As shown in FIG. 15, one input terminal of the multiplexer 302 is coupled to the output terminal of the multiplexer 21 to receive the control voltage V21, and the other input terminal thereof receives the supply voltage VDD. The multiplexer 21 is controlled by the signal S1311B[b] to provide the control voltage V21 or the supply voltage VDD for controlling the P-type transistor Ms5. An input terminal of the multiplexer 304 is coupled to the output terminal of the multiplexer 22 to receive the control voltage V22, and the other input terminal thereof receives the ground voltage GND. The multiplexer 304 is controlled by the signal S1311[b] to provide the control voltage V22 or the ground voltage GND for controlling the N-type transistor Ms6. When the value of S1311[b] is "1" and the value of the signal S1311B[b] is "0", the slice unit 300' is enabled. At this time, the multiplexer 304 selects the control voltage V22 to control the N-type transistor Ms6, the N-type transistor Ms6 operates in a saturation region (LVDS mode) or to be turned on (VML mode). The multiplexer 302 selects the control voltage V21 to control the P-type transistor Ms5, the P-type transistor Ms5 operates in the saturation region (LVDS mode) or to be turned on (VML mode). When the value of the signal S1311[b] is "0" and the value of the signal S1311B[b] is "1", the slice unit 300' is not enabled. At this time, the multiplexer 304 selects the ground voltage GND to turn off the N-type transistor Ms5, and the multiplexer 302 selects the supply voltage VDD to turn off the P-type transistor Ms5. Therefore, it is also possible to control the enabled/disenabled state of the slice unit by the complementary thermometer codes S1311[b] and S1311B[b], thereby controlling the number of turned-on slice units 300' in the VML mode. When the slice unit 300' is one of the slice units controlled by the thermometer codes PS_EN and PS_ENB, the signal S1311B[b] received by the multiplexer 302 is one bit of the thermometer codes PS_ENB, and the signal S1311[b] received by the multiplexer 304 is one bit of the thermometer codes PS_EN. When the slice unit 300' is one of the slice units controlled by the thermometer codes MAIN_EN and MAIN_ENB, the signal S1311B[b] received by the multiplexer 302 is one bit of the thermometer codes MAIN_ENB, and the signal S1311[b] received by the multiplexer 304 is one bit of the thermometer codes MAIN_EN. When the slice unit 300' is one of the slice units controlled by the thermometer codes DE_EN and DE_ENB, the signal S1311B[b] received by the multiplexer 302 is one bit of the thermometer code DE_ENB, and the signal S1311[b] received by the multiplexer 304 is one bit of the thermometer code DE_EN.

According to an embodiment of the invention, the input signal D and the inverted input signal DB received by the slice units controlled by the thermometer codes PS_EN and PS_ENB are configured as the input signal D[n−1] and the inverted input signal DB[n−1]. The input signal D and the inverted input signal DB received by the slice units controlled by the thermometer codes MAIN_EN and MAIN_ENB configured as the input signal D[n] and the inverted input signal DB[n]. The input signal D and the inverted input signal DB received by the slice units controlled by the thermometer codes DE_EN and DE_EN are configured as the input signal D[n+1] and the inverted input signal DB[n+1].

Moreover, according to another embodiment of the present invention, other types of second controllers 1311 may be configured to multiplex the input signals D and the inverted input signal DB of the previous unit time interval, the next unit time interval, and the current time interval in the same slice unit, thereby reducing the number of slice units.

Figure 16:
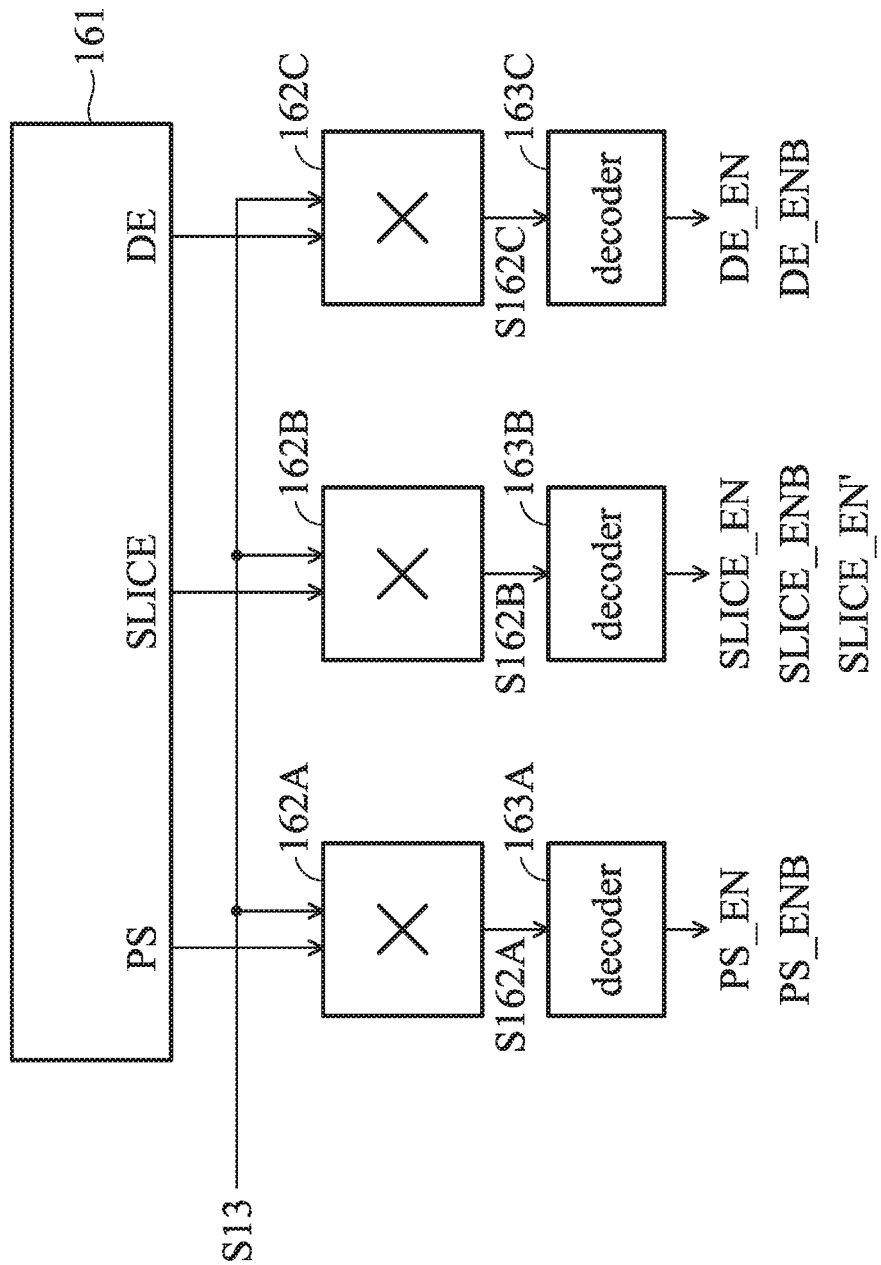
FIG. 16 is a schematic diagram showing a second controller 1311 according to an embodiment of the invention.

FIG. 16 is a schematic diagram showing the second controller 1311 according to an embodiment of the invention. FIG. 16 illustrates the cases that the equalization parameters are the pre-emphasis value PS, the standard value SLICE, and the de-emphasis value DE. The register 161 stores the pre-emphasis value PS, the standard value SLICE, and the de-emphasis value DE. The multipliers 162A~162C respectively read the pre-emphasis value PS, the standard value SLICE, and the de-emphasis value DE from the register 161. The multipliers 162A~162C receive the first control signal S13 from the divider 12. The multiplier 162A multiplies the pre-emphasis value PS with the first control signal S13 to obtain a value S162A. The multiplier 162B multiplies the standard value SLICE with the first control signal S13 to obtain a value S162B. The multiplier 162C multiplies the de-emphasis value DE with the first control signal S13 to obtain a value S162C.

The decoders 163A~163C respectively receive the values S162A~S162C and perform the binary-thermometer conversion on the values S162A-S162C to obtain a second control signal for controlling the fifth number of the slice units. The fifth number is a minimum number of the slice units should be configured, that is, in the worst case under the VML mode, such as in the case of FF process corner, all of the fifth number of the slice units should be turned on. The fifth number should satisfy the requirements related to the EQ step and the deviation between the process corners. Specifically, the fifth number may be calculated by a formula: (1/EQ step)×(1+maximum positive deviation)/(1+ maximum negative deviation). For example, in the cases that the EQ step is ¹⁄₂₄, the maximum deviation of the FF process corner with respect to the TT process corner is 25%, and the maximum deviation of the SS process corner with respect to the TT process corner is −25%. 40 slice units must be turned on to satisfy the requirements related to the EQ step and the maximum deviation between the process corners, i.e. the fifth number is equal to 40. Herein, in the case of FF process corner, the number of the parallel sub-resistors of the resistor 911 shown in FIG. 9 should be adjusted to the fifth number for matching with the external characteristic resistance.

As shown in FIG. 16, the decoder 163A receives the value S162A and performs the binary-thermometer conversion on the value S162A to obtain the thermometer code PS_EN and/or the thermometer code PS_ENB complementary to the thermometer code PS_EN for respectively controlling the inputs of the second number of the slice units. The decoder 163C receives the binary code S162C and performs the binary-thermometer conversion on the binary code S162C to obtain the thermometer code DE_EN and/or the thermometer code DE_ENB complementary to the thermometer code DE_EN for respectively controlling the inputs of the third number of the slice units. The decoder 163B receives the binary code S162B and performs the binary-thermometer conversion on the binary code S162B to obtain the thermometer code SLICE_EN, SLICE_EN' and/or the thermometer code SLICE_ENB complementary to the thermometer code SLICE_EN, herein the thermometer codes SLICE_EN and SLICE_ENB are used to enable the fifth number of the slice units. The thermometer code SLICE_EN' is obtained from the thermometer code SLICE_EN, for example the sixth number of the bits of end of the thermometer code SLICE_EN, to respectively control the inputs of the sixth number of the slice units.

Referring to FIG. 16, the values SLICE_EN and SLICE_ENB of the second control signals are generated through dividing the second resistance adjusting signal S11 by the standard value SLICE and then multiplying the standard value SLICE for turning on the fifth number the slice units. The value PS_EN of the second control signal is generated through dividing the second resistance adjusting signal S11 by the standard value SLICE and then multiplying the pre-emphasis value PS for controlling the inputs of the second number of the slice units. The value DE_EN of the second control signal is generated through dividing the second resistance adjusting signal S11 by the standard value SLICE and then multiplying the de-emphasis value DE for controlling the inputs of the third number of the slice units. Herein, the second resistance adjusting signal S11 is used to adjust the magnitude of the output impedance. The value SLICE_EN' of the second control signal is generated according to the value SLICE_EN for controlling the inputs of the sixth number of the parallel slice units. In the VML mode, the driver 1312 matches the external characteristic resistance, and compensates the EQ amplitude of the differential output signal TXOUT. The second number and the third number are still corresponding to the pre-emphasis value PS, the de-emphasis value DE, and the respective adjusting ranges of the corresponding EQ coefficients. The sixth number is obtained by subtracting the second number and the third number from the fifth number. The second control signals S1311 output by the decoders 163A~163C includes the above described thermometer codes PS_EN and/or PS_ENB, DE_EN and/or DE_EN, SLICE_EN and/or SLICE_ENB, and SLICE_EN'.

Figure 17:
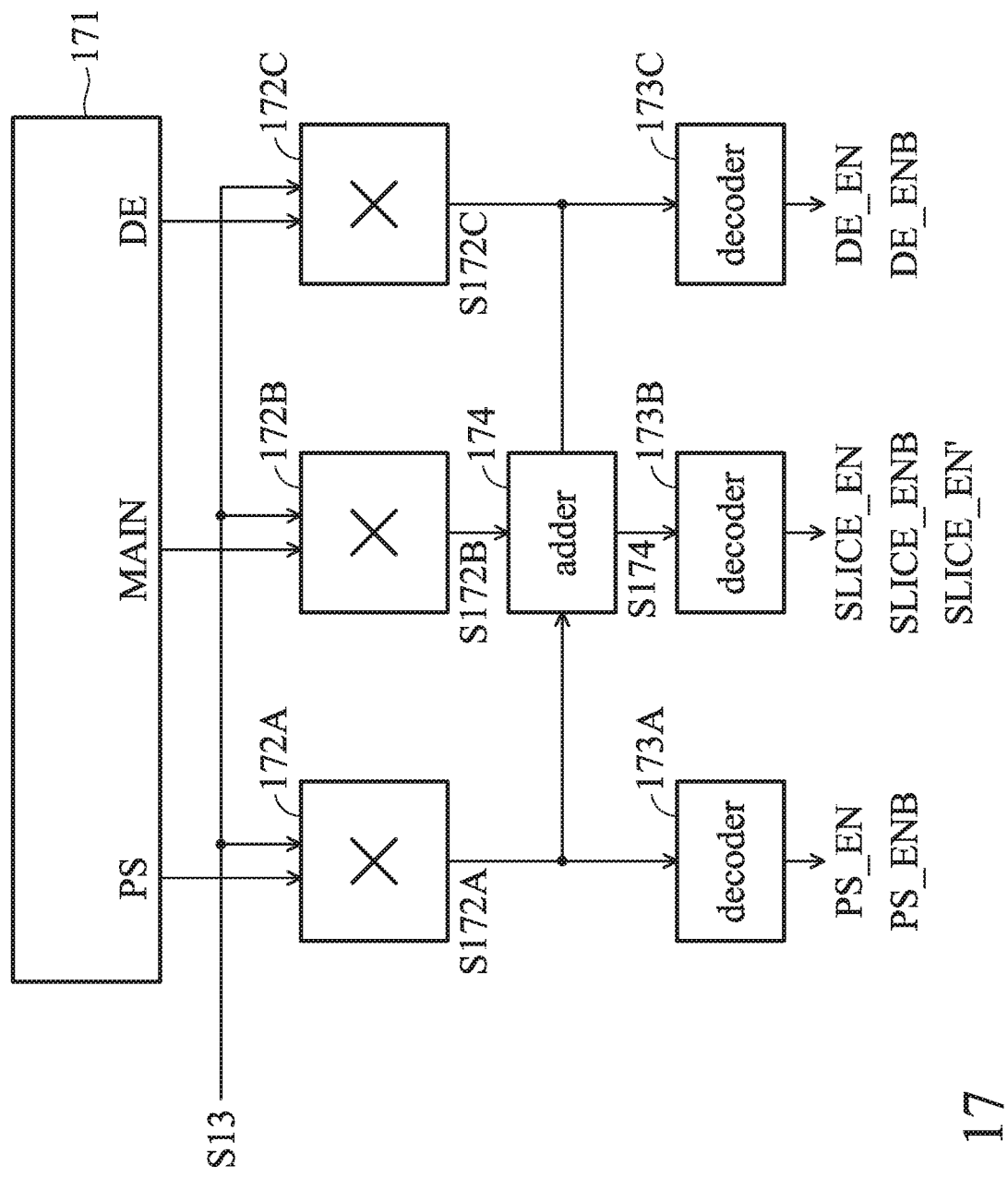
FIG. 17 is a schematic diagram showing a second controller 1311 according to an embodiment of the invention.

FIG. 17 is a diagram showing the second controller 1311 according to another embodiment of the present invention. The difference between FIG. 17 and FIG. 16 is that, in FIG. 17, the equalization parameters stored in the register 171 in the second controller 1311 are the values PS, MAIN, and DE, herein the equalization parameter MAIN is the difference of the foregoing value SLICE and the values PS, DE. Therefore, it is necessary to configure an adder 174 between the multiplier 172B and the decoder 173B. The adder 174 receives the values S172A, S172B, and S172C output from the multipliers 172A-172C to add the value S172B to the values S172A and S172C to obtain a value S174. The second control signals S1311 output by the second controller 1311 includes thermometer codes PS_EN and/or PS_ENB, DE_EN and/or DE_EN, SLICE_EN and/or SLICE_ENB, and SLICE_EN'.

According to another embodiment of the present invention, in the cases that there are two equalization parameters (2-tap FIR), the two equalization parameters are, for example, the pre-emphasis value PS and the main value MAIN, and then the fifth number is equal to the sum of the second number and the sixth number. Alternatively, the two equalization parameters are the main value MAIN and the de-emphasis value DE, and then the first number is equal to the sum of the third number and the sixth number.

According to another embodiment of the present invention, in the cases that there are four equalization parameters (4-tap FIR), the four equalization parameters are, for example, a first pre-emphasis value PS1, a second pre-emphasis value PS2, the main value MAIN, and the de-emphasize the value DE, and then the fifth number is equal to the sum of the third number, the sixth number, the seventh number corresponding to the first pre-emphasis value PS1 and the eighth number corresponding to the second pre-emphasis value PS2. Alternatively, the four equalization parameters are the pre-emphasis value PS, the main value MAIN, a first de-emphasis value DE1, and a second de-emphasis value DE2, and then the fifth number is equal to the sum of the second number, the sixth number, the ninth number corresponding to the first de-emphasis value DE1 and the tenth number corresponding to the second de-emphasis value DE2.

Figure 18:
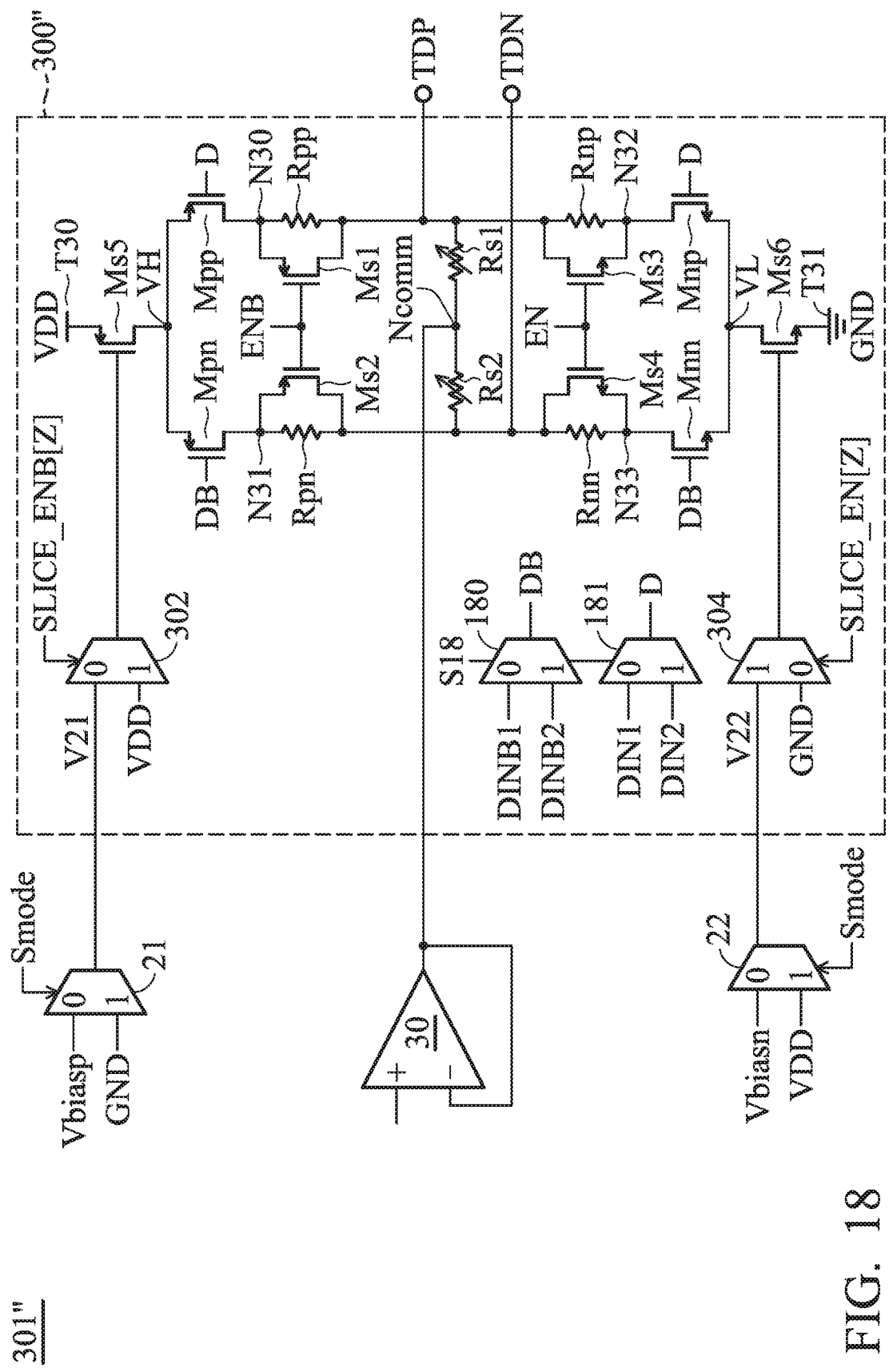
FIG. 18 is a schematic diagram showing a slice module 301" according to an embodiment of the present invention.

FIG. 18 is a schematic diagram showing a slice module 301" according to an embodiment of the present invention. The slice module 301" is configured for the second controller 1311 shown in FIG. 16 or FIG. 17. The slice module 301" may correspond to any slice unit 300" of the driver 1312. Compared with the slice unit 300' shown in FIG. 15, the slice unit 300' further comprises multiplexers 180~181.

The multiplexer 180 receives the input signals DINB1 and DINB2 and is controlled by a selection signal S18 to take the input signal DINB1 or DINB2 as the inverted input signal DB. The multiplexer 181 receives the input signals DIN1 and DIN2 and is controlled by the selection signal S18 to selectively take the input signal DIN1 or DIN2 as the input signal D. In an embodiment, for the second number of the slice units controlled by the thermometer code PS_EN, the multiplexers 180~181 of each slice unit 300" are controlled by one bit of the thermometer code PS_EN, that is, one bit of the thermometer code PS_EN is used as the selection signal S18 for one slice unit 300". The input signals DINB1 and DINB2 of the multiplexer 180 are the inverted input signal DB[n] and the inverted input signal DB[n−1] respectively, and the input signals DIN1 and DIN2 are the input signals D[n] and the input signal D[n−1] respectively. When the selection signal S18 is at a second logic level (for example, a logic high level), the input signal D[n−1] is taken as the input signal D, and the inverted input signal DB[n−1] is taken as the inverted input signal DB. When the selection signal S18 is at a first logic levels (for example, a logic low level), the input signal D[n] is selected as the input signal D, and the inverted input signal DB[n] is selected as the inverted input signal DB.

In one embodiment, for the third number of the slice units 300" controlled by the thermometer code DE_EN, the multiplexers 180~181 of each slice unit 300" are controlled by one bit of the thermometer code DE_EN, that is, one bit of the thermometer code DE_EN is used as the selection signal S18 for one slice unit 300". The input signals DINB1 and DINB2 of the multiplexer 180 are the input signal DB[n] and the input signal DB[n+1] respectively, and the input signals DIN1 and DIN2 are the input signal D[n] and the input signal D[n+1] respectively. When the selection signal S18 is a second logic level (for example, a logic high level), the input signal D[n+1] is taken as the input signal D, and the input signal DB[n+1] is taken as the input signal DB. When the selection signal S18 is at a first logic level (for example, a logic low level), the input signal D[n] is taken as the input signal D, and the input signal DB[n] is taken as the input signal DB.

In one embodiment, for the sixth number of the circuit slices 300" controlled by the thermometer code SLICE_EN', the multiplexers 180~181 of each slice unit 300" is controlled by one bit of the thermometer code SLICE_EN, that is, one bit of the thermometer code SLICE_EN' is used as the selection signal S18 for the slice unit 300". The input signals DINB1 and DINB2 of the multiplexer 180 are the input signal DB[n] and "0" respectively, and the input signals DIN1 and DIN2 are the input signal D[n] and "0" respectively. When the selection signal S18 is at a second logic level (for example, a logic high level), "0" is taken as the input signal D, and "0" is taken as the input signal DB. When the selection signal S18 is at a first logic level (for example, a logic low level), the input signal D[n] is selected as the input signal D, and the inverted input signal DB[n] is selected as the inverted input signal DB.

As described above, through multiplexing the input signal D[n−1], the input signal D[n], and the input signal D[n+1] by the multiplexers 180~181, only the fifth number of the slice units of the driver 1312 should be configured to match the external characteristic resistance, and compensate the EQ amplitude of the differential output signal TXOUT. For example, when the EQ step is 1/24, the maximum deviation between the FF process corner and the TT process corner is 25%, and the maximum deviation between the SS process corner and the TT process corner is −25%, the driver of the present application may configure 40 slice units 300" for the channel. Herein the fifth number is equal to the sum of the second number, the third number, and the six number. The above embodiment may achieve the target of saving area by compressing the number of slice units, but the multiplexers 180~181 disposed in each slice unit 300" may increase the power consumption of transmitting the differential serial signal TXOUT.

Based on the instructions of the present application, those skilled in the art should be able to know the structures of the other lanes of the TX terminal or may adopt the structures of the second controller 1311 and the driver 1312 described in the present application.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A driving system operating in a first mode or a second mode, comprising:
a first resistance adjusting circuit, generating and outputting a first resistance adjusting signal;
a second resistance adjusting circuit, generating and outputting a second resistance adjusting signal;
a divider, coupled to the second resistance adjusting circuit, receiving the second resistance adjusting signal and dividing the second resistance adjusting signal by a standard value to generate a first control signal;
a second controller, coupled to the divider, receiving the first control signal and generating a second control signal; and
a driver, when the driving system operates in the first mode, the driver is coupled to the second controller to receive the second control signal, according to the second control signal, the driver adjusts an output impedance of the driver and adjusts equalization amplitude of a first differential output signal generated by the driver,
when the driving system operates in the second mode, the driver is coupled to the first resistance adjusting circuit to receive the first resistance adjusting signal, and the driver generates a second differential output signal and adjusts the output impedance according to the first resistance adjusting signal.

2. The driving system as claimed in claim 1, wherein the second resistance adjusting circuit comprises:
a bandgap reference voltage circuit, generating a first reference voltage, a second reference voltage, a third reference voltage, and a fourth reference voltage; and
a resistance controller, receiving the first reference voltage, the second reference voltage, the third reference voltage, and the fourth reference voltage,
wherein the resistance controller generates a reference current flowing through a fifth resistor and a sixth resistor according to the first reference voltage, such that a first voltage is generated at a first output terminal and a second voltage is generated at a second output terminal,
wherein the resistance controller fixes a node voltage between the fifth resistor and the sixth resistor according to the second reference voltage, and
wherein the resistance controller receives the first voltage and the second voltage and generates the first resistance adjusting signal according to a difference between the third reference voltage and the fourth reference voltage and a difference between the first voltage and the second voltage.

3. The driving system as claimed in claim 1, wherein the second resistance adjusting circuit comprises:
a bandgap reference voltage circuit, generating a first reference voltage and a second reference voltage; and
a resistance controller, receiving the first reference voltage and the second reference voltage and comprising a seventh resistor coupled to a first node,
wherein the resistance controller generates a reference current flowing through the seventh resistor according to the first reference voltage, such that a first voltage is generated at the first node,
wherein the resistance controller compares the second reference voltage with the first voltage to generate a comparison result and generates the second resistance adjusting signal according to the comparison result,
wherein the resistor controller adjusts the number of seventh resistors that are turned on to a first number according to the second resistance adjusting signal to adjust the output impedance, such that the adjusted output impedance matches with an external impedance,
wherein the seventh resistor is configured by replicating the first resistor or the second resistor or the third resistor or the fourth resistor, and
wherein the first resistor, the second resistor, the third resistor, and the fourth resistor have the same resistance value and the same structure.

4. The driving system as claimed in claim 1, wherein the second controller comprises:
a register, storing a first equalization value and a second equalization value which are used to control the equalization amplitude of the second differential output signal;
a multiplier, coupled to the divider to receive the first control signal and coupled to the register to read the first equalization value and the second equalization value, wherein the multiplier multiplies the first control signal and the first equalization value to obtain a first value, multiplies the first control signal and the second equalization value to obtain a second value; and
a decoder, coupled to the multiplier to receive the first value and the second value, wherein the decoder performs a binary-thermometer conversion on the first value to obtain a first thermometer code and on the second value to obtain a second thermometer code,
wherein the second control signal comprises the first thermometer code and the second thermometer code.

5. The driving system as claimed in claim 4, wherein the register stores a third equalization value controlling the equalization amplitude of the second differential output signal,
wherein the multiplier is coupled to the register to read the third equalization value and multiplies the first control signal and the third equalization value to obtain a third value,
wherein the decoder is coupled to the multiplier to receive the third value and performs the binary-thermometer conversion on the third value to obtain a third thermometer code, and
wherein the second control signal comprises the third thermometer code.

6. The driving system as claimed in claim 1, wherein the driver comprises:
a fifth resistor, a first terminal the fifth resistor is coupled to a first output terminal, and a second terminal of the fifth resistor is coupled to a common mode node;
a sixth resistor, a first terminal of the sixth resistor is coupled to a second output terminal, and a second terminal of the sixth resistor is coupled to the common mode node;
an operational amplifier, an inverting input terminal and an output terminal of the operational amplifier are coupled to the common mode node, a non-inverting input of the operational amplifier receives a first reference voltage to fix a voltage of the common mode node, wherein resistance values of the fifth resistor and the sixth resistor are adjusted by the first resistance adjusting signal for adjusting the output impedance.

7. The driving system as claimed in claim 6, wherein the fifth resistor comprises:
a plurality of first resistor-switch sets, coupled in parallel between the first output terminal and the common mode node, wherein the first resistance adjusting signal controls an on/off state of each of the plurality of first resistor-switch sets to adjust the resistance value of the fifth resistor,
the sixth resistor comprises:
a plurality of second resistor-switch sets, coupled in parallel between the common mode node and the second output terminal, wherein the first resistance adjusting signal controls an on/off state of each of the plurality of second resistor-switch sets to adjust the resistance value of the sixth resistor.

8. The driving system as claimed in claim 1, wherein the driver comprises:
a first multiplexer, controlled by a mode selecting signal to take a first supply voltage or a first bias voltage as a first control voltage;
a second multiplexer, controlled by the mode selecting signal to take a second supply voltage or a second bias voltage as a second control voltage; and
a slice unit, coupled to the first multiplexer and the second multiplexer, receiving the first control voltage and the second control voltage, the slice unit supports an operation of the first mode or the second mode according to the first control voltage and the second control voltage,
wherein the first supply voltage is lower than the second supply voltage.

9. The driving system as claimed in claim 8, wherein the slice unit receives the second control signal, a first enable signal, a second enable signal, and a differential pair to generate the first differential output signal or the second differential output signal between a first output terminal and a second output terminal, and the slice unit comprises:
a third multiplexer, coupled to the first multiplexer, controlled by the second control signal to output the first control voltage or the second supply voltage;
a fourth multiplexer, coupled to the second multiplexer, controlled by the second control signal to output the second control voltage or the first supply voltage;
a first transistor, a first terminal of the first transistor receives the second supply voltage, and a control terminal of the first transistor is coupled to the third multiplexer to receive the first control voltage or the second supply voltage;
a second transistor, a first terminal of the second transistor is coupled to a second terminal of the first transistor, and a control terminal of the second transistor receives one signal of the differential pair;
a third transistor, a first terminal of the third transistor is coupled to the second terminal of the first transistor, and a control terminal of the third transistor receives the other signal of the differential pair;
a first resistor, a first terminal of the first resistor is coupled to a second terminal of the second transistor, and a second terminal of the first resistor is coupled to the first output terminal;
a fourth transistor, a first terminal of the fourth transistor is coupled to the second terminal of the second transistor, a second terminal of the fourth transistor is coupled to the second output terminal, and a control terminal of the fourth transistor receives the first enable signal;
a second resistor, a first terminal of the second resistor is coupled to a second terminal of the third transistor, and a second terminal of the second resistor is coupled to the second output terminal;
a fifth transistor, the first terminal of the fifth transistor is coupled to the second terminal of the third transistor, a second terminal of the fifth transistor is coupled to the second output terminal, and a control terminal of the fifth transistor receives the first enable signal;
a third resistor, a first terminal of the third resistor is coupled to the first output terminal;
a sixth transistor, a first terminal of the sixth transistor is coupled to the first output terminal, a second terminal of the sixth transistor is coupled to a second terminal of the third resistor, and a control terminal of the sixth transistor receives the second enable signal;
a seventh transistor, a first terminal of the seventh transistor is coupled to the second terminal of the third resistor and the second terminal of the sixth transistor, and the control terminal of the seventh transistor receives the one signal of the differential pair;
a fourth resistor, a first terminal of the fourth resistor is coupled to the second output terminal;
an eighth transistor, a first terminal of the eighth transistor is coupled to the second output terminal, a second terminal of the eighth transistor is coupled to a second terminal of the fourth resistor, and a control terminal of the eighth transistor receives the second enable signal;
a ninth transistor, a first terminal of the ninth transistor is coupled to the second terminal of the fourth resistor and the second terminal of the eighth transistor, and a control terminal of the ninth transistor receives the other signal of the differential pair; and
a tenth transistor, a first terminal of the tenth transistor is coupled to a second terminal of the seventh transistor and a second terminal of the ninth transistor, a second terminal of the tenth transistor is coupled to the first supply voltage, and a control terminal of the tenth transistor is coupled to the fourth multiplexer to receive the second control voltage or the first supply voltage.

10. The driving system as claimed in claim 8, wherein when the mode selecting signal is a first logic level, the slice unit supports the operation of the second mode, the first multiplexer outputs the first bias voltage according to the mode selecting signal, the second multiplexer outputs the second bias voltage according to the mode selecting signal, the third multiplexer and the fourth multiplexer respectively output the first bias voltage and the second bias voltage according to the second control signal which is set to enable the slice unit, such that the first transistor and the tenth transistor operate in a saturation region, the fourth transistor and the fifth transistor are turned on according to the first enable signal, and the sixth transistor and the eighth transistor are turned on according to the second enable signal.

11. The driving system as claimed in claim 8, wherein when the mode selecting signal is a second logic level, the slice unit supports the operation of the first mode, the first multiplexer outputs the first supply voltage according to the mode selecting signal, the second multiplexer outputs the second supply voltage according to the mode selecting signal, the third multiplexer outputs the first supply voltage or the second supply voltage according to the second control signal, and the fourth multiplexer outputs the second supply voltage or the first supply voltage according to the second control signal,
- wherein when the third multiplexer outputs the first supply voltage and the fourth multiplexer outputs the second supply voltage, the first transistor and the tenth transistor are turned on, the slice unit is turned on,
- wherein when the third multiplexer outputs the second supply voltage and the fourth multiplexer outputs the first supply voltage, the first transistor and the tenth transistor are turned off, the slice unit is turned off, and
- wherein the fourth transistor and the fifth transistor are turned off according to the first enable signal, and the sixth transistor and the eighth transistor are turned off according to the second enable signal.

12. The driving system as claimed in claim 8, wherein the driver adjusts a number to a first number by controlling an on/off state of the slice unit through the second control signal, thereby adjusting the output impedance to match with an external impedance, wherein the first number is the number of turned-on slice units.

13. The driving system as claimed in claim 12, wherein the driver adjusts a second number by controlling the on/off state of the slice unit through the second control signal being a first thermometer code, and adjusts a third number by controlling the on/off state of the slice unit through the second control signal being a second thermometer code, such that the equalization amplitude of the first differential output signal is adjusted, wherein the second number and the third number are respectively the number of the turned-on slice units.

14. The driving system as claimed in claim 13, wherein the driver turns on the second number of slice units by controlling the on/off state of the slice unit through the second control signal being the first thermometer code, the driver turns on the third number of the slice units by controlling the on/off state of the slice unit through the second control signal being the second thermometer code, the driver adjusts the equalization amplitude of the first differential output signal by adjusting the second number and the third number, and
- wherein the first number is equal to the sum of the second number and the third number.

15. The driving system as claimed in claim 14, wherein the driver turns on the fourth number of the slice units by controlling the on/off state of the slice unit through the second control signal being a third thermometer code, the driver adjusts the equalization amplitude of the first differential output signal by adjusting the second number, the third number, and the fourth number, and
- wherein the first number is equal to the sum of the second number, the third number, and the fourth number.

16. The driving system as claimed in claim 8, wherein the slice unit further comprises:
- a fifth multiplexer and a sixth multiplexer, controlled by the second control signal,
- when the second control signal is a first thermometer code, multiplexing a differential pair or a previous differential pair through the fifth multiplexer and the sixth multiplexer,
- when the second control signal is a second thermometer code, multiplexing "0" or the differential pair through the fifth multiplexer and the sixth multiplexer.

17. The driving system as claimed in claim 16, wherein the driver turns on a fifth number of slice units through the second control signal, the driver controls inputs of the second number of the slice units through the second control signal being a first thermometer code, the driver controls inputs of a sixth number of the slice units through the second control signal being a second thermometer code, and the driver adjusts the equalization amplitude of the first differential output signal by adjusting the second number and the sixth number, and
- wherein the fifth number is equal to the sum of the second number and the sixth number.

18. The driving system as claimed in claim 17, wherein the driver controls inputs of the fourth number of the slice units by controlling the on/off state of the slice unit through the second control signal being a third thermometer code, the driver adjusts the equalization amplitude of the first differential output signal by adjusting the second number, the sixth number, and the fourth number, and
- wherein the first number is equal to the sum of the second number, the sixth number, and the fourth number.

19. A driving system operating in a first mode, comprising:
- a second resistance adjusting circuit, generating and outputting a second resistance adjusting signal;
- a divider, coupled to the second resistance adjusting circuit, receiving the second resistance adjusting signal and dividing the second resistance adjusting
- a second controller, coupled to the divider, receiving the first control signal and generating a second control signal; and
- a driver, coupled to the second controller, receiving the second control signal, according to the second control signal, the driver adjusts an output impedance of the driver and adjusts equalization amplitude of a differential output signal generated by the driver.

20. The driving system as claimed in claim 19, wherein the second resistance adjusting circuit comprises:
- a bandgap reference voltage circuit, generating a first reference voltage and a second reference voltage; and
- a resistance controller, receiving the first reference voltage and the second reference voltage and comprises a first resistor coupled to a first node,
- wherein the resistance controller generates a reference current flowing through the first resistor according to the first reference voltage, such that a first voltage is generated at the first node,
- wherein the resistance controller compares the second reference voltage with the first voltage to generate a comparison result and generates the second resistance adjusting signal according to the comparison result,
- wherein the resistor controller adjusts the number of turned on first resistors to a first number according to the second resistance adjusting signal, and
- wherein the first resistor is configured by replicating a second resistor or a third resistor or a fourth resistor or a fifth resistor, and the second resistor, the third resistor, the fourth resistor, and the fifth resistor, have the same resistance value and the same structure.

21. The driving system as claimed in claim 19, wherein the second controller comprises:
- a register, storing a first equalization value and a second equalization value controlling the equalization amplitude of the differential output signal;
- a multiplier, coupled to the divider to receive the first control signal and coupled to the register to read the first equalization value and the second equalization value, wherein the multiplier multiplies the first control signal and the first equalization value to obtain a first value and multiplies the first control signal and the second equalization value to obtain a second value; and a decoder, coupled to the multiplier to receive the first value and the second value, the decoder performs a binary-thermometer conversion on the first value to obtain a first thermometer code and on the second value to obtain a second thermometer code, wherein the second control signal comprises the first thermometer code and the second thermometer code.

22. The driving system as claimed in claim 21, wherein the register stores a third equalization value controlling the equalization amplitude of the differential output signal, wherein the multiplier is coupled to the register to read the third equalization value and multiplies the first control signal and the third equalization value to obtain a third value, wherein the decoder is coupled to the multiplier to receive the third value and performs the binary-thermometer conversion on the third value to obtain a third thermometer code, and wherein the second control signal comprises the third thermometer code.

23. The driving system as claimed in claim 19, wherein the driver comprises a slice unit, the slice unit receives the second control signal and a differential pair to generate the differential output signal between a first output terminal and a second output terminal, and the slice unit comprises:

a first multiplexer, controlled by the second control signal to output the first supply voltage or the second supply voltage;

a second multiplexer, controlled by the second control signal to output the second supply voltage or the first supply voltage;

a first transistor, a first terminal of the first transistor receives the second supply voltage, and a control terminal of the first transistor is coupled to the first multiplexer to receive the first supply voltage or the second supply voltage;

a second transistor, a first terminal of the second transistor is coupled to a second terminal of the first transistor, and a control terminal of the second transistor receives one signal of the differential pair;

a third transistor, a first terminal of the third transistor is coupled to the second terminal of the first transistor, and a control terminal of the third transistor receives the other signal of the differential pair;

a second resistor, a first terminal of the second resistor is coupled to a second terminal of the second transistor, and a second terminal of the second resistor is coupled to the first output terminal;

a third resistor, a first terminal of the third resistor is coupled to a second terminal of the third transistor, and a second terminal of the third resistor is coupled to the second output terminal;

a fourth resistor, a first terminal of the fourth resistor is coupled to the first output terminal;

a fifth resistor, a first terminal of the fifth resistor is coupled to the second output terminal;

a fourth transistor, a first terminal of the fourth transistor is coupled to the second terminal of the fourth resistor, and a control terminal of the fourth transistor receives the one signal of the differential pair;

a fifth transistor, a first terminal of the fifth transistor is coupled to a second terminal of the fifth resistor, and a control terminal of the fifth transistor receives the other signal of the differential pair; and a sixth transistor, a first terminal of the sixth transistor is coupled to a second terminal of the fourth transistor and a second terminal of the fifth transistor, a second terminal of the sixth transistor is coupled to the first supply voltage, and a control terminal of the tenth transistor is coupled to the second multiplexer to receive the second supply voltage or the first supply voltage.

24. The driving system as claimed in claim 23, wherein the first multiplexer outputs the first supply voltage or the second supply voltage according to the second control signal, and the second multiplexer outputs the second supply voltage or the first supply voltage according to the second control signal, wherein when the first multiplexer outputs the first supply voltage and the second multiplexer outputs the second supply voltage, the first transistor and the sixth transistor are turned on, the slice unit is turned on, and wherein when the first multiplexer outputs the second supply voltage and the second multiplexer outputs the first supply voltage, the first transistor and the sixth transistor are turned off, the slice unit is turned off.

25. The driving system as claimed in claim 23, wherein the driver adjusts a number to a first number by controlling an on/off state of the slice unit through the second control signal, thereby adjusting the output impedance to match with an external impedance, wherein the first number is the number of turned-on slice units.

26. The driving system as claimed in claim 25, wherein the driver turns on a second number of slice units by controlling an on/off state of the slice unit through the second control signal being a first thermometer code, the driver turns on a third number of the slice units by controlling the on/off state of the slice unit through the second control signal being a second thermometer code, and the driver adjusts the equalization amplitude of the differential output signal by adjusting the second number and the third number, and wherein the first number is equal to the sum of the second number and the third number.

27. The driving system as claimed in claim 26, wherein the driver turns on the fourth number of the slice units by controlling the on/off state of the slice unit through the second control signal being a third thermometer code, and the driver adjusts the equalization amplitude of the differential output signal by adjusting the second number, the third number, and the fourth number, and wherein the first number is equal to the sum of the second number, the third number, and the fourth number.

28. The driving system as claimed in claim 23, wherein the slice unit further comprises:

a third multiplexer and a forth multiplexer, wherein the third multiplexer and the fourth multiplexer are controlled by the second control signal, when the second control signal is a first thermometer code, multiplexing the differential pair or a previous differential pair through the third multiplexer and the fourth multiplexer, and when the second control signal is a second thermometer code, multiplexing "0" or the differential pair through the third multiplexer and the fourth multiplexer.

29. The driving system as claimed in claim 28, wherein the driver turns on a fifth number of slice units through the second control signal, the driver controls inputs of a second number of the slice units through the second control signal being a first thermometer code, the driver controls inputs of a sixth number of the slice units through the second control signal being a second thermometer code, and the driver adjusts the equalization amplitude of the differential output signal by adjusting the second number and the sixth number, and wherein the fifth number is equal to the sum of the second number and the sixth number.

30. The driving system as claimed in claim 29, wherein the driver controls inputs of the fourth number of the slice units by controlling the on/off state of the slice unit through the second control signal being a third thermometer code, and the driver adjusts the equalization amplitude of the differential output signal is adjusted by adjusting the second number, the sixth number, and the fourth number, and wherein the fifth number is equal to the sum of the second number, the sixth number, and the fourth number.

* * * * *